(12) United States Patent
Yajima

(10) Patent No.: US 8,945,329 B2
(45) Date of Patent: Feb. 3, 2015

(54) PRINTED WIRING BOARD AND METHOD FOR MANUFACTURING PRINTED WIRING BOARD

(75) Inventor: Naohiko Yajima, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

(21) Appl. No.: 13/483,660

(22) Filed: May 30, 2012

(65) Prior Publication Data

US 2012/0328857 A1    Dec. 27, 2012

Related U.S. Application Data

(60) Provisional application No. 61/500,913, filed on Jun. 24, 2011.

(51) Int. Cl.
B32B 37/02    (2006.01)

(52) U.S. Cl.
USPC ........... 156/247; 156/152; 156/249; 156/289; 156/307.7

(58) Field of Classification Search
CPC .... B32B 43/006; B32B 37/025; B32B 37/02; B32B 7/06; B32B 15/04; B32B 2037/268; B32B 2250/05; B32B 7/045; H01L 2221/68381
USPC ............... 156/249, 289, 307.7, 247, 152, 182
See application file for complete search history.

(56) References Cited

U.S. PATENT DOCUMENTS

| 7,038,142 | B2 | 5/2006 | Abe | |
| 7,346,982 | B2* | 3/2008 | Kim et al. | 29/847 |
| 2006/0121256 | A1* | 6/2006 | Kim et al. | 428/209 |
| 2009/0011220 | A1* | 1/2009 | Park et al. | 428/317.5 |
| 2009/0283302 | A1* | 11/2009 | Lee et al. | 174/255 |
| 2011/0253315 | A1* | 10/2011 | George | 156/718 |
| 2012/0012553 | A1* | 1/2012 | Japp et al. | 216/18 |
| 2012/0037305 | A1* | 2/2012 | Yamashita et al. | 156/247 |

FOREIGN PATENT DOCUMENTS

| CN | 1980542 A | 6/2007 |
| CN | 101562169 A | 10/2009 |
| CN | 101673688 A | 3/2010 |
| CN | 101869008 A | 10/2010 |
| JP | 2003-008207 | 1/2003 |

(Continued)

OTHER PUBLICATIONS

Seong Lee, Method for Manufacturing Printed Circuit Board, Nov. 23, 2002, KP 20020087643A, Machine Translation.*

*Primary Examiner* — Daniel McNally
*Assistant Examiner* — Margaret Squalls
(74) *Attorney, Agent, or Firm* — Oblon, Spivak, McClelland, Maier & Neustadt, L.L.P.

(57) ABSTRACT

A method for manufacturing a printed wiring board includes laminating a first core substrate and a second core substrate, forming a first upper buildup layer on a surface of the first core substrate, forming a second upper buildup layer on a surface of the second core substrate, separating the first core substrate and the second core substrate from each other, laminating the first upper buildup layer formed on the first core substrate and the second upper buildup layer formed on the second core substrate, forming a first lower buildup layer on the opposite surface of the first core substrate, forming a second lower buildup layer on the opposite surface of the second core substrate, and separating the first upper buildup layer and the second upper buildup layer.

18 Claims, 22 Drawing Sheets

(56) References Cited

FOREIGN PATENT DOCUMENTS

| | | |
|---|---|---|
| JP | 2004-095851 | 3/2004 |
| JP | 2004214273 A * | 7/2004 |
| JP | 2010-087524 | 4/2010 |
| JP | 2010-206192 A | 9/2010 |
| KR | 1020020087643 | 11/2002 |

\* cited by examiner (A)

(B)

(A)

(B)

(A)

(B)

(A)

(B)

(A)

(B)

(B)

(A)

(B)

(A)

(B)

(A)

(B)

(A)

(B)

(A)

(B)

(C)

PRINTED WIRING BOARD AND METHOD FOR MANUFACTURING PRINTED WIRING BOARD

CROSS-REFERENCE TO RELATED APPLICATIONS

The present application is based on and claims the benefit of priority to U.S. Application No. 61/500,913, filed Jun. 24, 2011, the entire contents of which are incorporated herein by reference.

BACKGROUND OF THE INVENTION

1. Field of the Invention

The present invention relates to a printed wiring board having a buildup layer on both surfaces of a core substrate and to a method for manufacturing such a printed wiring board.

2. Discussion of the Background

In Japanese Laid-Open Patent Publication No. 2010-87524, a laminated wiring section is formed on a reinforcing substrate using a buildup method, and a printed wiring board is manufactured by removing the laminated wiring section from the reinforcing substrate. Japanese Laid-Open Patent Publication No. 2004-95851 describes in its FIGS. 1, 6 and 9 forming a buildup layer on upper and lower surfaces of a core substrate. In addition, the number of insulation layers is the same on the upper and lower surfaces of the core substrate. The entire contents of these publications are incorporated herein by reference.

SUMMARY OF THE INVENTION

According one aspect of the present invention, a method for manufacturing a printed wiring board includes laminating a first core substrate and a second core substrate, forming a first upper buildup layer on a surface of the first core substrate, forming a second upper buildup layer on a surface of the second core substrate, separating the first core substrate and the second core substrate from each other, laminating the first upper buildup layer formed on the first core substrate and the second upper buildup layer formed on the second core substrate, forming a first lower buildup layer on the opposite surface of the first core substrate, forming a second lower buildup layer on the opposite surface of the second core substrate, and separating the first upper buildup layer and the second upper buildup layer.

According to another aspect of the present invention, a printed wiring board has a core substrate having a first surface and a second surface on the opposite side of the first surface, an upper buildup layer formed on the first surface of the core substrate and having an outermost resin insulation layer, and a lower buildup layer formed on the second surface of the core substrate and having an outermost resin insulation layer. The outermost resin insulation layer of the upper buildup layer contains a material which is different from a material of the outermost resin insulation layer of the lower buildup layer.

According to yet another aspect of the present invention, a printed wiring board has a core substrate having a first surface and a second surface on the opposite side of the first surface, an upper buildup layer formed on the first surface of the core substrate and including resin insulation layers, and a lower buildup layer formed on the second surface of the core substrate and including one or more resin insulation layers. The resin insulation layers in the upper buildup layer include an outermost resin insulating layer, the resin insulation layer or layers in the lower buildup layer include an outermost resin insulating layer, and the resin insulation layers in the upper buildup layer have a greater number of layers than the resin insulation layer or layers in the lower buildup layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
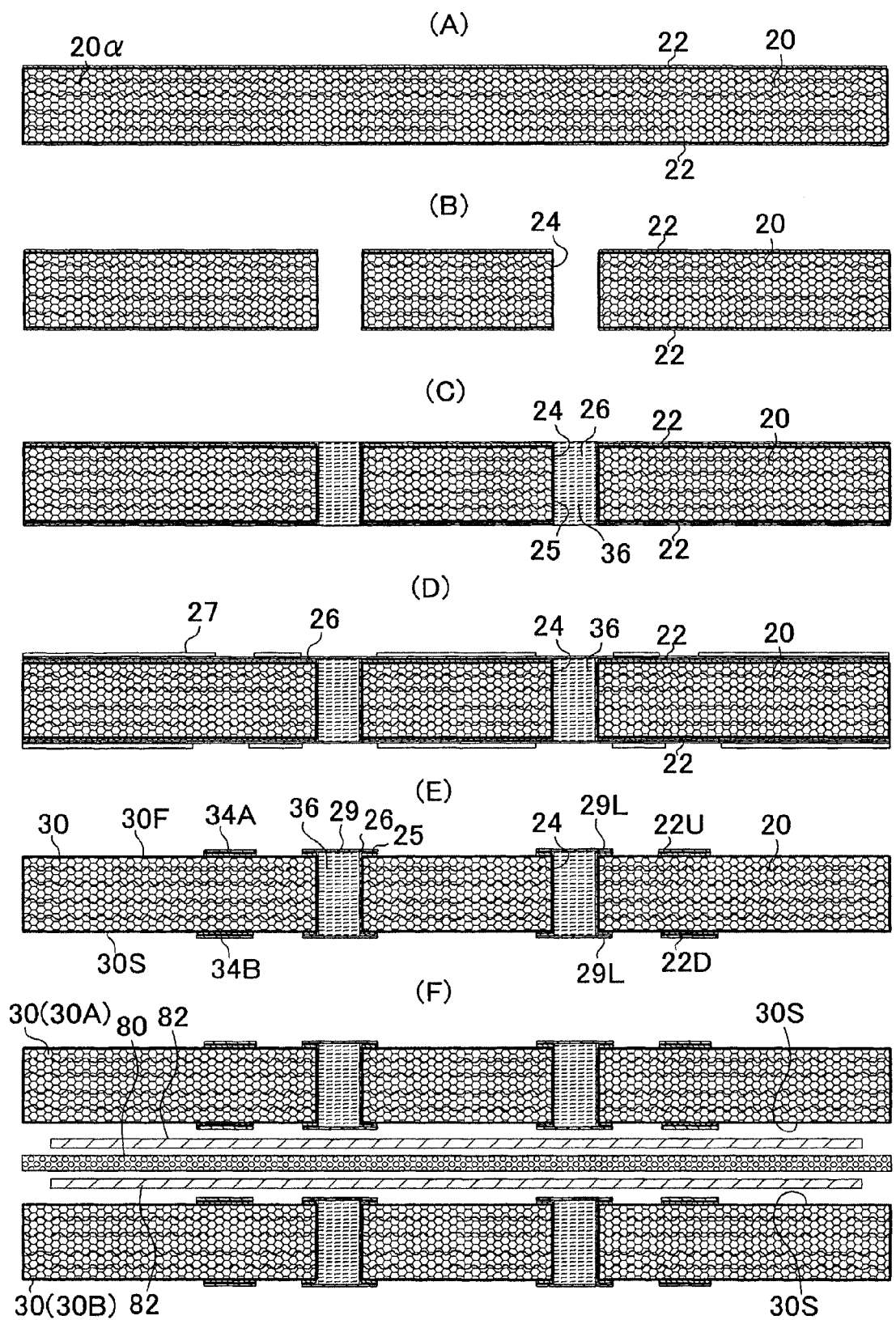
FIGS. 1(A)-1(F) are views of steps showing a method for manufacturing a printed wiring board according to a first embodiment of the present invention.
Figure 2:
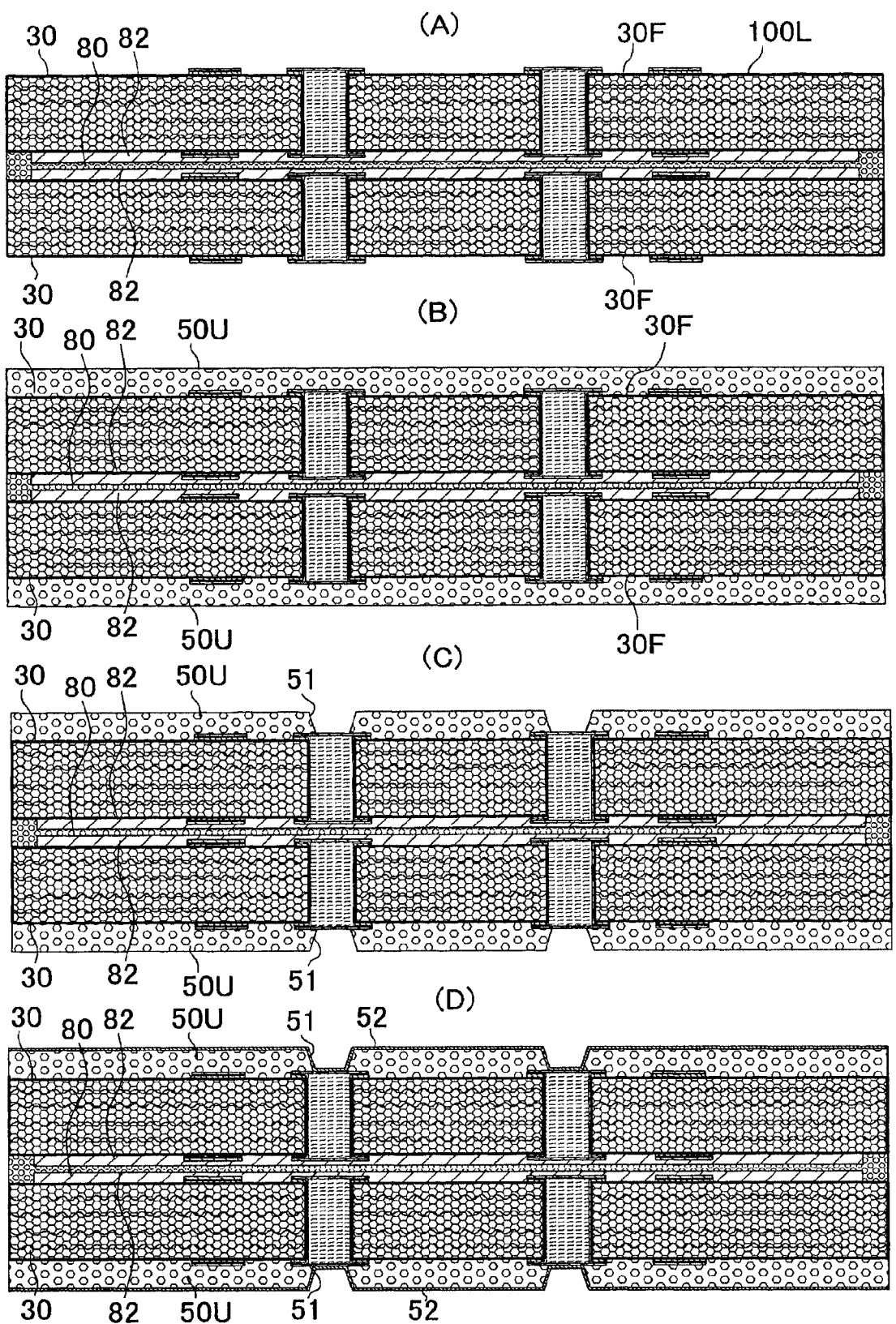
FIGS. 2(A)-2(D) are views of steps showing the method for manufacturing a printed wiring board according to the first embodiment.
Figure 3:
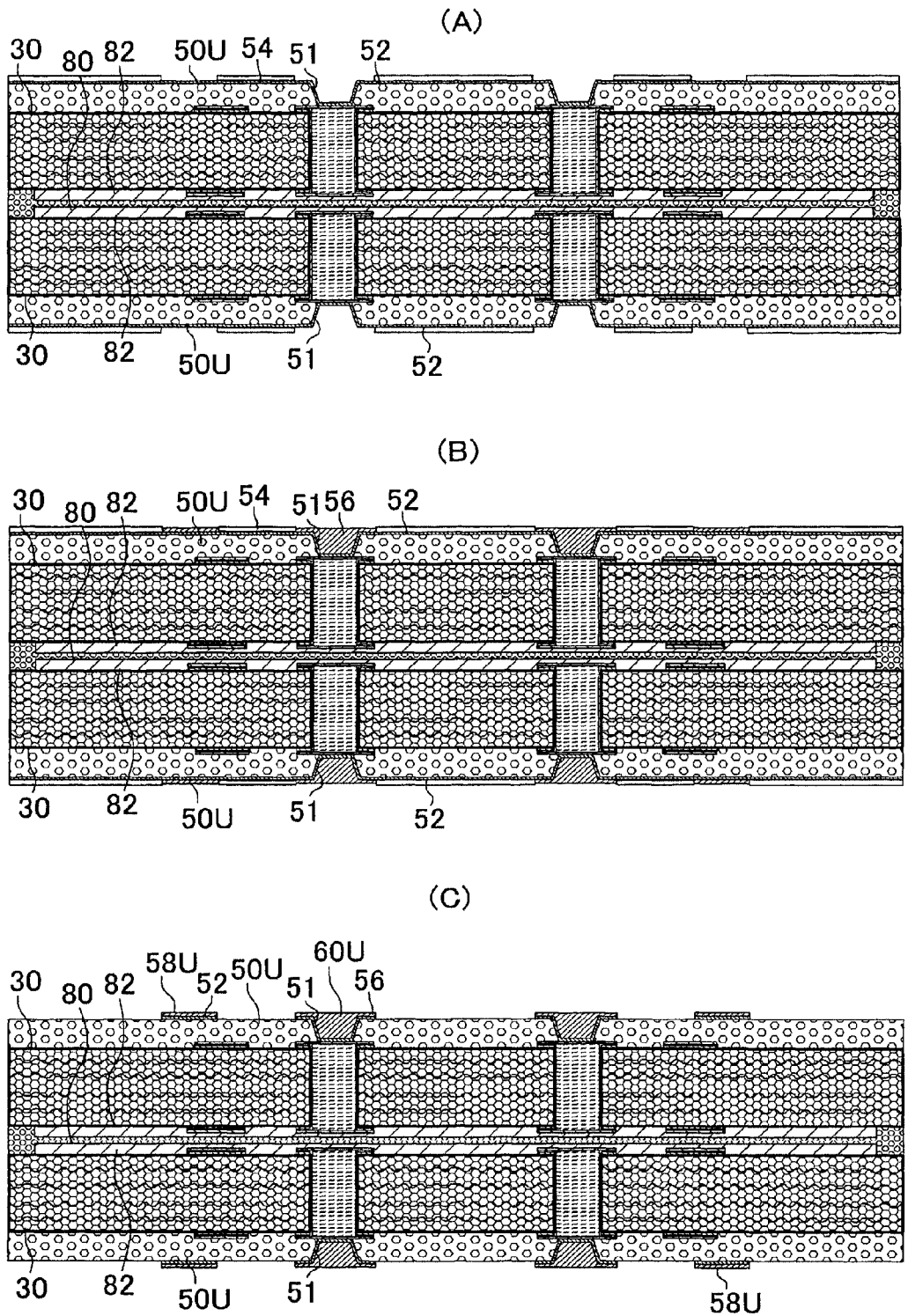
FIGS. 3(A)-3(C) are views of steps showing the method for manufacturing a printed wiring board according to the first embodiment.
Figure 4:
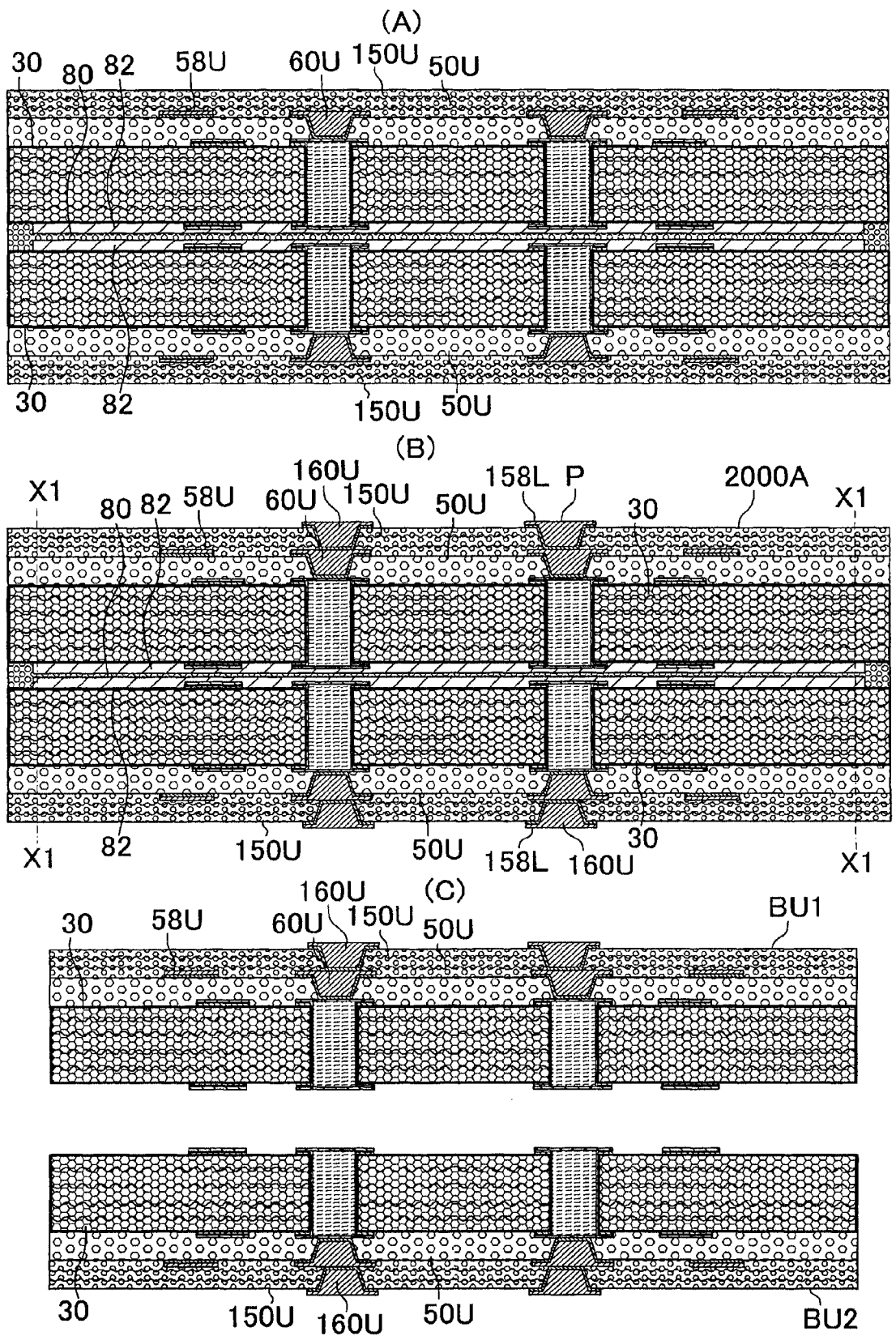
FIGS. 4(A)-4(C) are views of steps showing the method for manufacturing a printed wiring board according to the first embodiment.
Figure 5:
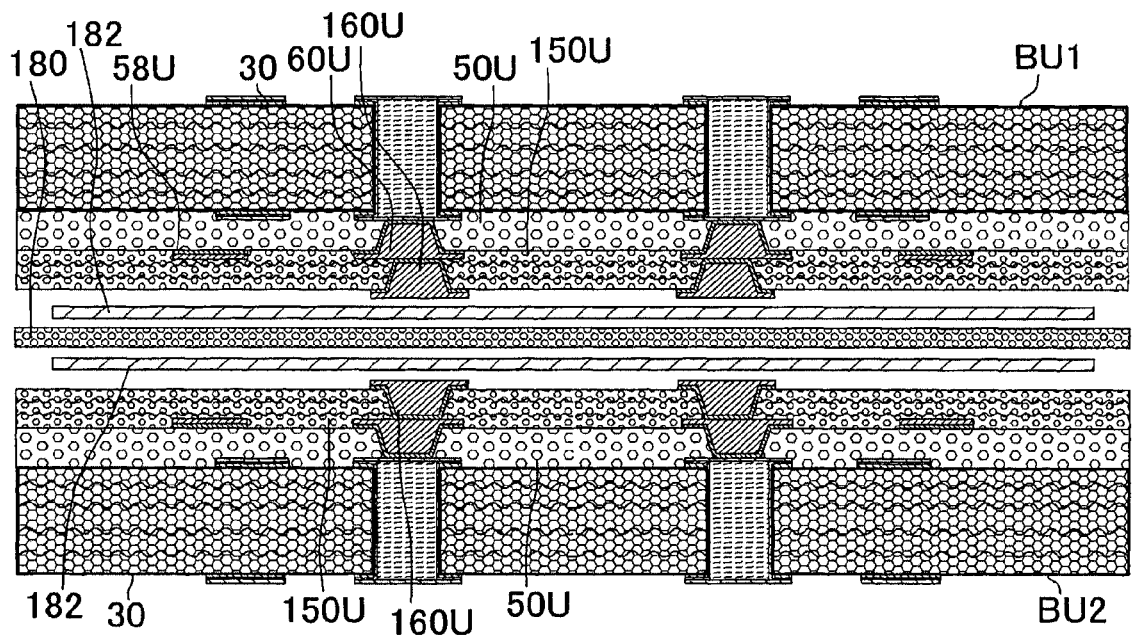
FIGS. 5(A)-5(B) are views of steps showing the method for manufacturing a printed wiring board according to the first embodiment.
Figure 5:
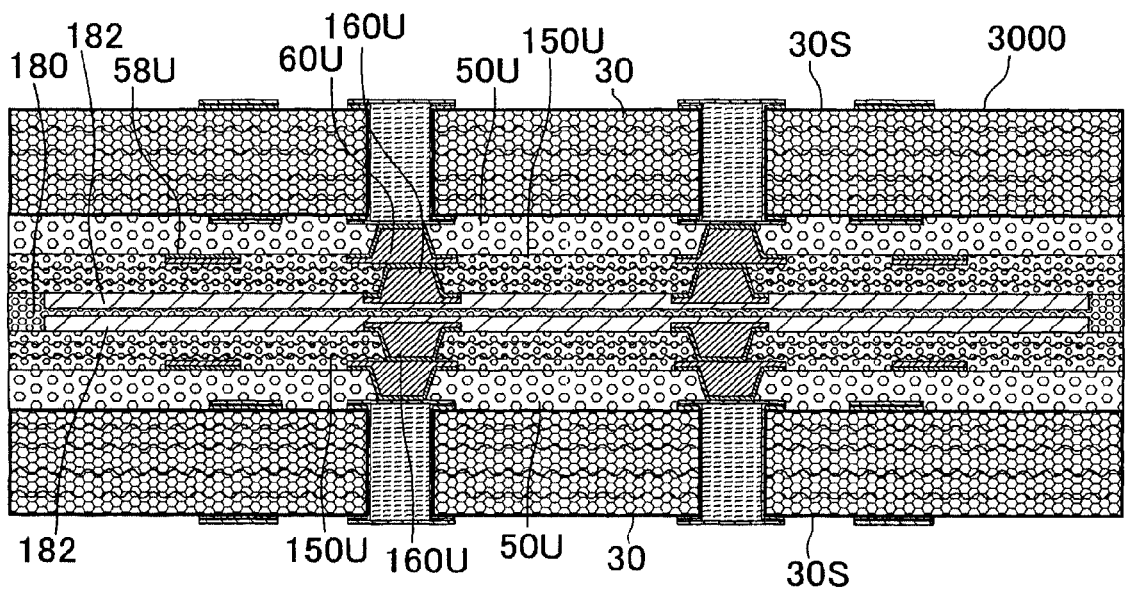

The embodiments will now be described with reference to the accompanying drawings, wherein like reference numerals designate corresponding or identical elements throughout the various drawings.

First Embodiment

Figure 8:
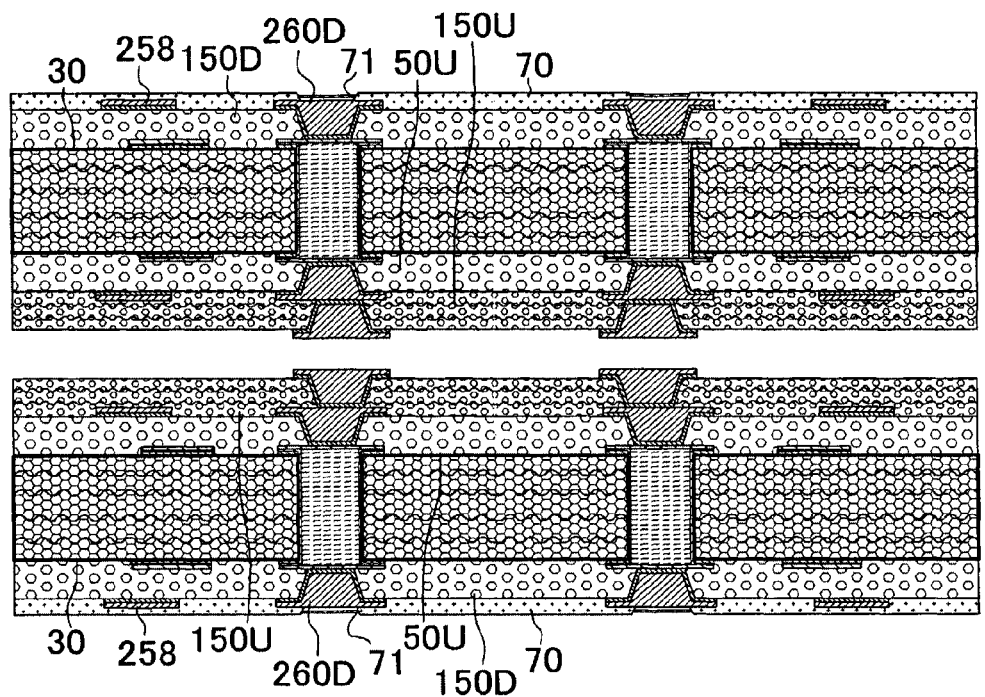
FIGS. 8(A)-8(B) are views showing a step in the method for manufacturing a printed wiring board according to the first embodiment and the printed wiring board.
Figure 8:
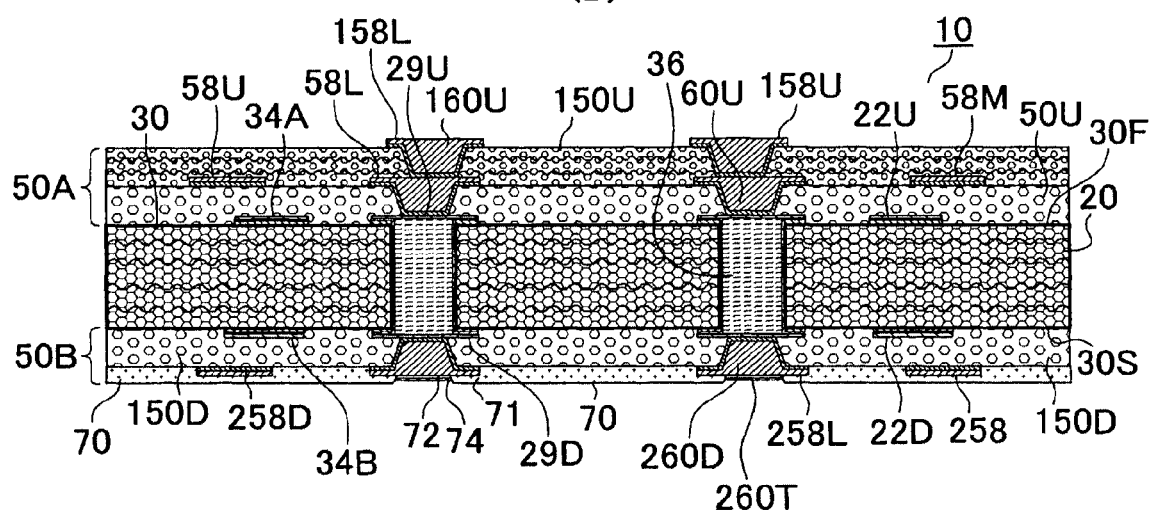
Figure 9:
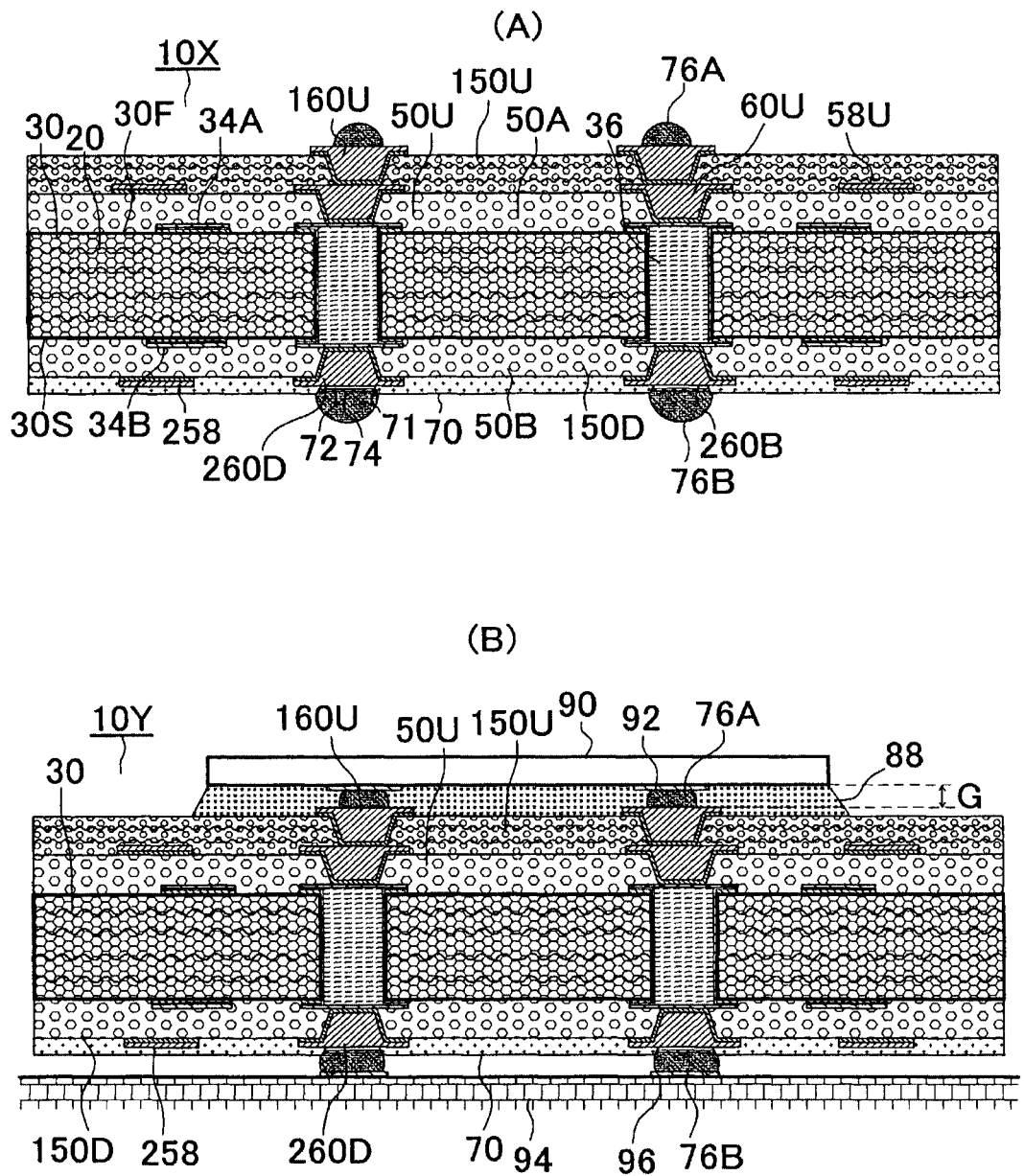
FIGS. 9(A)-9(B) are applied examples of a printed wiring board according to the first embodiment.

FIG. 8(B) shows a cross-sectional view of printed wiring board 10 according to a first embodiment of the present invention. FIG. 9(A) shows printed wiring board (10X) having solder bumps. FIG. 9(B) is an applied example of printed wiring board 10. Printed wiring board 10 has core substrate 30, upper buildup layer (first buildup layer) (50A) formed on first surface (30F) of the core substrate, and lower buildup layer (second buildup layer) (50B) formed on second surface (30S) of the core substrate. Conductive layer (22U) is formed on first surface (30F) of insulative substrate (resin substrate) 20. Conductive layer (22U) has conductive circuit (34A) and cover circuit (29U) on a through-hole conductor. Conductive layer (22D) is formed on the second surface of core substrate 30. Conductive layer (22D) has conductive circuit (34B) and cover circuit (29D) on a through-hole conductor. Conductive layer (22U) and conductive layer (22D) are connected by through-hole conductor 36. Core substrate 30 is formed with insulative substrate 20, conductive layers (22U, 22D) on the insulative substrate, and through-hole conductor 36. The first surface of the core substrate corresponds to the first surface of the insulative substrate, and the second surface of the core substrate corresponds to the second surface of the insulative substrate.

The first buildup layer has resin insulation layer (50U) on the core substrate and outermost resin insulation layer (150U) on resin insulation layer (50U). Also, the first buildup layer has conductive layer (58U) on resin insulation layer (50U) and conductive layer (158U) on outermost resin insulation layer (150U). Conductive layer (58U) includes conductive circuit (58M) and via land (58L). Resin insulation layer (50U) has via conductor (60U), and conductive layer (22U) and conductive layer (58U) are connected by via conductor (60U). In addition, outermost resin insulation layer (150U) has via conductor (160U), and conductive layer (58U) and conductive layer (158U) are connected by via conductor (160U). Conductive layer (158U) includes via land (158L).

The second buildup layer has outermost resin insulation layer (150D) on the core substrate and conductive layer (258D) on outermost resin insulation layer (150D). Conductive layer (258D) includes conductive circuit 258 and via land (258L). Outermost resin insulation layer (150D) has via conductor (260D), and conductive layer (22D) on the core substrate and conductive layer (258D) are connected by via conductor (260D).

In the first embodiment, solder resist 70 is formed on the second buildup layer to expose terminal (260T) for connection with a motherboard. Solder resist is not formed on the first buildup layer. The upper surface of outermost resin insulation layer (150U) of the first buildup layer is exposed. Via conductor (160U) and via land (158L) surrounding the via conductor work as a pad for mounting an IC chip. No conductive circuit is formed on outermost resin insulation layer (150U) of the first buildup layer in the first embodiment, and conductive layer (158U) is formed only with via lands.

Figure 21:
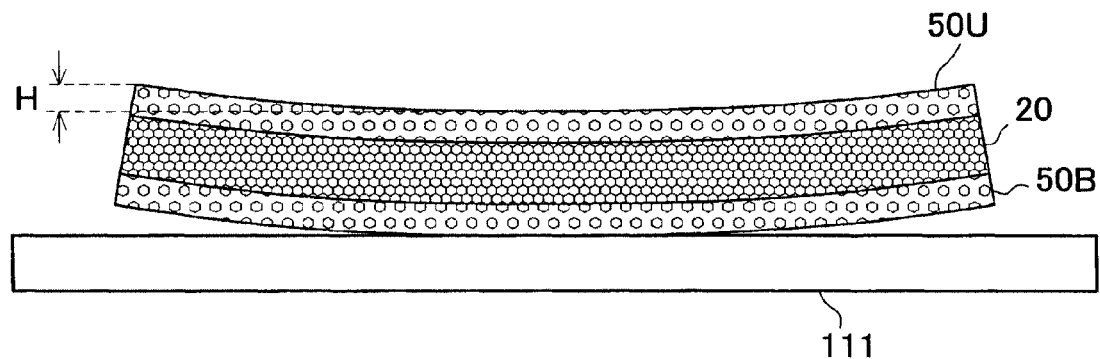
FIG. 21 is a view to illustrate warping of a printed wiring board.

Since the number of resin insulation layers in the first buildup layer is greater than the number of resin insulation layers in the second buildup layer, printed wiring board 10 may warp as shown in FIG. 21. By forming a solder-resist layer only on the second buildup layer, warping as shown in FIG. 21 is reduced.

Solder bump (76A) is formed on a pad, and solder bump (76B) is formed on a terminal (FIG. 9(A)). The upper buildup layer corresponds to the first buildup layer, and the lower buildup layer corresponds to the second buildup layer. In a printed wiring board according to the first embodiment, the numbers of resin insulation layers are different in the first buildup layer and the second buildup layer. Then, IC chip 90 is mounted on the first buildup layer, and printed wiring board 10 is mounted on a motherboard through terminal (260T) formed on the second buildup layer. Since an IC chip is mounted on the first buildup layer, the numbers of wiring lines and via conductors formed in the first buildup layer are greater than the numbers of wiring lines and via conductors formed in the second buildup layer.

In the first embodiment, the number of resin insulation layers is determined according to the required numbers of wiring lines and via conductors. The number of resin insulation layers in the first buildup layer is greater than the number of resin insulation layers in the second buildup layer. Strength is improved in the second buildup layer of a printed wiring board in the first embodiment. As a result, a printed wiring board according to the first embodiment has higher connection reliability with a motherboard. Since power is supplied to an IC chip quickly when a printed wiring board is thin, a printed wiring board according to the first embodiment is suitable for a printed wiring board to mount a high-speed IC chip. Also, since the number of resin insulation layers is small, warping or undulation decreases in the printed wiring board. In addition, since the upper buildup layer tends to be made flat, the mounting reliability of an IC chip is enhanced.

The difference is preferred to be one between the number of resin insulation layers in the first buildup layer and the number of resin insulation layers in the second buildup layer. If the difference is two or greater, the upper and lower surfaces of the core substrate become unbalanced, and it may become difficult to design circuits.

Since the first buildup layer is connected to an IC chip, and the second buildup layer is connected to a motherboard, the material of the outermost resin insulation layer of the first buildup layer is preferred to be different from the material of the outermost resin insulation layer of the second buildup layer. Physical properties such as the thermal expansion coefficient (CTE) and the elastic modulus of the outermost resin insulation layer of the first buildup layer are preferred to be closer to those of the IC chip, and physical properties such as the thermal expansion coefficient and the elastic modulus of the outermost resin insulation layer of the second buildup layer are preferred to be closer to those of the motherboard. Connection reliability is enhanced between printed wiring board 10 and the IC chip and between printed wiring board 10 and the motherboard. In addition, cracking seldom occurs in resin insulation layers and conductive layers of printed wiring board 10. Therefore, the CTE of the outermost resin insulation layer of the first buildup layer is preferred to be lower than the CTE of the outermost resin insulation layer of the second buildup layer. The elastic modulus of the outermost resin insulation layer of the first buildup layer is preferred to be greater than that of the outermost resin insulation layer of the second buildup layer. Specifically, the outermost resin insulation layer of the first buildup layer contains reinforcing material such as glass cloth, and the outermost resin insulation layer of the second buildup layer does not contain reinforcing material such as glass cloth. S-glass is preferred as the material of glass cloth. Alternatively, outermost resin insulation layers of the first and second buildup layers may contain inorganic particles such as silica, and the amount of silica in the outermost resin insulation layer of the first buildup layer is greater than the amount of silica in the outermost resin insulation layer of the second buildup layer. The inorganic particles in the outermost resin insulation layer of the first buildup layer are preferred to include larger-diameter inorganic particles and smaller-diameter inorganic particles, whereas the inorganic particles in the outermost resin insulation layer of the second buildup layer are preferred to include either larger-diameter inorganic particles or smaller-diameter inorganic particles. The amount of inorganic particles increases in the outermost resin insulation layer of the first buildup layer. Here, diameters indicate average particle diameters, and the smaller diameter is preferred to be in the range of 0.05 μm to 0.5 μm, and the larger diameter is preferred to be in the range of 1 μm to 10 μm, The outermost resin insulation layer of the first buildup layer may contain reinforcing material and inorganic particles described above. Resin substrate 20 of core substrate 30 contains reinforcing material such as glass cloth. E-glass is preferred as the material of the reinforcing material. When a resin insulation layer in the first buildup layer contains reinforcing material made of S-glass, the insulative substrate of the core substrate contains reinforcing material made of E-glass, and a resin insulation layer in the second buildup layer does not contain reinforcing material, physical properties change in the first buildup layer, the core substrate and the second buildup layer in that order from the physical properties of the IC chip to those of the motherboard. Accordingly, connection reliability is enhanced between the printed wiring board and the IC chip and between the printed wiring board and the motherboard. The insulative substrate may further contain inorganic particles.

Among the resin insulation layers in the first buildup layer, a resin insulation layer other than the outermost resin insulation layer may or may not contain reinforcing material. Reinforcing material made of S-glass is preferred for the reinforcing material. When a resin insulation layer other than the outermost resin insulation layer contains reinforcing material, physical properties of the first buildup layer come closer to those of the IC chip, enhancing connection reliability between the IC chip and printed wiring board 10. When a resin insulation layer other than the outermost resin insulation layer does not contain reinforcing material, fine via conductors (via conductors of 60 μm or smaller) are formed in the resin insulation layer other than the outermost resin insulation layer. Since the number of resin insulation layers in the first buildup layer can be set smaller, thin printed wiring board 10 with a smaller chance of warping is obtained. In FIG. 8(B), resin insulation layer (50U), made of ABF resin without core material (brand name: ABF-45SH made by Ajinomoto), is formed on first surface (30F) of core substrate 30. Outermost resin insulation layer (150U) contains S-glass reinforcing material and inorganic particles.

As for the reinforcing material contained in resin substrate 20 of the core substrate and outermost resin insulation layer 150, aramid fiber may be listed in addition to glass cloth. Because of reinforcing material (core material) and inorganic particles contained in outermost resin insulation layer 150 of the first buildup layer, the thermal expansion coefficient comes closer to that of IC chip 90.

The CTE of the second buildup layer is greater than the CTE of the core substrate. The CTE of the first buildup layer is lower than the CTE of the core substrate. The elastic modulus of the second buildup layer is lower than that of the core substrate. The elastic modulus of the first buildup layer is preferred to be higher than that of the core substrate. The elastic modulus and CTE of the core substrate are the values obtained in cured resin substrate 20.

In printed wiring board 10 of the first embodiment, the number of resin insulation layers in first buildup layer (50A) on which to mount IC chip 90 is greater than the number of resin insulation layers in second buildup layer (50B). Therefore, due to the curing contraction of resin insulation layers, printed wiring board 10 tends to warp by scores of microns at room temperature. The direction of warping is shown in FIG. 21. In FIG. 21, printed wiring board 10 is placed on a flat board so that the first buildup layer is set in an upward direction. The printed wiring board warps in such a way that the center of the printed wiring board (an IC chip mounting position) is recessed. The amount of warping (H) is 0~50 μm. When an IC chip is mounted (mounting temperature), the printed wiring board becomes flat and the IC chip is securely connected to the pads of the printed wiring board.

Since no solder-resist layer is formed on first buildup layer (50A), gap (G) is enlarged between printed wiring board 10 and IC chip 90 (FIG. 9(B)). The gap is the distance between a pad and an electrode of the IC chip. Thus, the height of solder bump (76A) becomes greater, increasing the absorption amount of thermal stress by solder bump (76A). Accordingly, connection reliability is enhanced between the IC chip and the printed wiring board. Also, it is easier to fill underfill 88 between IC chip 90 and printed wiring board 10. No solder-resist layer is formed on first buildup layer (50A) having a greater number of resin insulation layers, while solder-resist layer 70 is formed on second buildup layer (50B) having fewer resin insulation layers. Accordingly, the amounts of resin curing contraction come closer to each other on the upper and lower sides of the core substrate. Warping is reduced in the printed wiring board.

FIGS. 1~8 show a method for manufacturing printed wiring board 10 according to the first embodiment.

(1) Copper-clad laminate (20a) is prepared, where copper foil 22 with a thickness of 3~36 μm is laminated on both surfaces of insulative substrate 20 (insulative substrate or resin substrate) with a thickness of 0.04~0.2 mm (FIG. 1(A)). First penetrating hole 24 is formed in the copper-clad laminate using a drill (FIG. 1(B)), electroless plated film 25 is formed by an electroless plating treatment, electrolytic plated film 26 is formed by an electrolytic plating treatment, and through-hole conductor 36 is formed in penetrating hole 24 (FIG. 1(C)).

(2) A commercially available dry film is laminated on both surfaces of substrate 20, and etching resists 27 are formed (FIG. 1(D)).

(3) Then, plated films (25, 26) and copper foil 22 in portions exposed from etching resists 27 are removed using an etching solution, and etching resists 27 are removed. Accordingly, conductive layers (22U, 22D) are formed on the core substrate (FIG. 1(E)). Core substrate 30 is completed. The core substrate has first surface (30F) and second surface (30S) opposite the first surface. Conductive layers (22U, 22D) include land (29L) of through-hole conductor 36.

(4) A sheet of prepreg 80, two core substrates (30, 30) (first core substrate (30A) and second core substrate (30B)) and two copper foils (82, 82) are prepared. The prepreg and core substrates are substantially the same size, and copper foils 82 are smaller than the core substrates. However, the copper foil is larger than the region where conductive layer (22D) is formed. Copper foils (82, 82) are laminated on both surfaces of the prepreg. The prepreg is sandwiched by two copper foils (82, 82). Core substrates 30 sandwich copper foils (82, 82) and prepreg 80 in such a way that second surfaces (30S) of two core substrates face each other (FIG. 1(F)). Copper foils 82 cover conductive layers (22U, 22D), but the peripheral portions of the core substrates are exposed from the copper foils. The insulative substrates are left exposed by the copper foils. Then, thermal pressing is conducted so that two core substrates are laminated by prepreg 80 (FIG. 2(A)). The insulative substrates exposed from the copper foils are adhered by the prepreg. The periphery of the insulative substrate of the first core substrate is bonded to the periphery of the insulative substrate of the second core substrate. Laminate (100L) is completed. The first surface of a core substrate is set in an outward direction. In the following steps, each treatment is conducted on laminate (100L) where two core substrates are laminated. Therefore, even if the thickness of each insulative substrate is small, since the thickness of laminate (100L) is great, warping is slight in laminate (100L) during a lamination step, laser step, patterning step or the like. Even if the thickness of each insulative substrate is small, the film thickness of a resin insulation layer and the film thickness of a conductive layer are made uniform according to the first embodiment. Impedance is controlled. Fine conductive circuits are formed. Buildup layers are made flat.

(5) Resin insulation layer (inner resin insulation layer) (50U) is formed on first surfaces (30F) of both core substrates (30A, 30B) (FIG. 2(B)). Resin insulation layer (50U) is made of inorganic particles such as silica and of resin such as epoxy resin. Resin insulation layer (50U) may further contain reinforcing material.

(6) A laser is used to form openings 51 in resin insulation layers (50U) (FIG. 2(C)). Then, surfaces of resin insulation layers are roughened (not shown in the drawings).

(7) Electroless plated film 52 is formed on surfaces of resin insulation layers (50U) and openings 51 (FIG. 2(D)).

(8) Plating resist 54 with a predetermined pattern is formed on electroless plated film 52 (FIG. 3(A)).

(9) Electrolytic plated film 56 is formed on the electroless plated film exposed from the plating resist (FIG. 3(B)).

(10) The plating resist is removed, electroless plated film 52 between portions of electrolytic plated film 56 is etched away, and via conductors (60U) and conductive layers (58U) are formed (FIG. 3(C)).

(11) Outermost resin insulation layer (150U) is formed on resin insulation layers (50U) and conductive layers (58U) (FIG. 4(A)). Outermost resin insulation layer (150U) is made of inorganic particles such as silica, glass cloth made of S-glass, and epoxy resin.

(12) By treatments the same as (6)~(10) described above, via conductors (160U) and via lands (158L) are formed (FIG. 4(B)). On surfaces of outermost resin insulation layers (150U), lands of via conductors are formed but conductive circuits are not formed. Pad (P) made of a via conductor and a land is formed. No solder-resist layer is formed on the surfaces of outermost resin insulation layers (150U). First buildup layers are formed on the core substrates, and intermediate substrate (2000A) is completed. On the first surface of the first core substrate and on the first surface of the second core substrate, buildup layers are formed to have the same number of resin insulation layers and the same number of conductive layers. Since intermediate substrate (2000A) is symmetrical at prepreg 80, warping is slight in the intermediate substrate. The surface on which to mount an IC chip is made flat. The inner resin insulation layer on the first surface of the first core substrate is preferred to be made of the same material as that of the inner resin insulation layer on the first surface of the second core substrate; and the outermost resin insulation layer on the first surface of the first core substrate is preferred to be made of the same material as that of the outermost resin insulation layer on the first surface of the second core substrate. In addition, the conductive layer formed on the inner resin insulation layer on the first surface of the first core substrate is preferred to be designed the same as the conductive layer formed on the inner resin insulation layer on the first surface of the second core substrate; and the conductive layer formed on the outermost resin insulation layer on the first surface of the first core substrate is preferred to be designed the same as the conductive layer formed on the outermost resin insulation layer on the first surface of the second core substrate. Warping is slight in the intermediate substrate.

(13) The intermediate substrate is cut along the (X1-X1) lines in FIG. 4(B) which are located inside copper foils 82 so that two core substrates are separated (FIG. 4(C)). The copper foils and prepreg are removed from the second surfaces of the core substrates. The copper foils and prepreg are integrated so that they are removed from the core substrates at the same time. Two single-sided buildup substrates (BU1, BU2) are obtained.

(14) A sheet of prepreg 180, two copper foils (182, 182) and two single-sided buildup substrates (BU1, BU2) are prepared. The prepreg and the single-sided buildup substrates are substantially the same size, and copper foils 182 are smaller than the single-sided buildup substrates. Two single-sided buildup substrates, two copper foils and a sheet of prepreg are laminated. The prepreg is sandwiched by two copper foils. Single-sided buildup substrates sandwich copper foils (182, 182) and prepreg 180 in such a way that the core substrates of two single-sided buildup substrates face each other (FIG. 5(A)). Copper foil 182 covers conductive layer (158U), but the peripheral portion of the outermost resin insulation layer is exposed from the copper foil. The periphery of the outermost resin insulation layer is left exposed by the copper foil. Then, thermal pressing is conducted to laminate two single-sided buildup substrates (BU1, BU2) by prepreg 180 (FIG. 5(B)). The outermost resin insulation layers exposed from copper foils are adhered by the prepreg. The periphery of the outermost resin insulation layer of first single-sided buildup substrate (BU1) is bonded to the periphery of the outermost resin insulation layer of second single-sided buildup substrate (BU2). Second laminate 3000 is completed. The second surface of a core substrate is set in an outward direction. In the following steps, each treatment is conducted on second laminate 3000 where two single-sided buildup substrates are laminated. Therefore, even if the thickness of each single-sided buildup substrate is small, since the thickness of the second laminate is great, warping is slight in the second laminate during a lamination step, laser step, patterning step or the like. According to the first embodiment, even if the thickness of one insulative substrate is small, the film thickness of a resin insulation layer and the film thickness of a conductive layer are made uniform. Impedance is controlled. Fine conductive circuits are formed. Buildup layers are made flat.

(15) Resin insulation layer (150D) (outermost resin insulation layer) is formed on second surface (30S) of both core substrates (30A, 30B) (FIG. 6(A)). As for the material of resin insulation layers, ABF made by Ajinomoto may be listed.

(16) By treatments the same as (6)~(10) described above, via conductors (260D) and conductive layers 258 are formed (FIG. 6(B)). The outermost resin insulation layer on the second surface of the first core substrate is preferred to be made of the same material as that of the outermost resin insulation layer on the second surface of the second core substrate. Also, the conductive layer formed on the outermost resin insulation layer on the second surface of the first core substrate is preferred to be designed the same as the conductive layer on the outermost resin insulation layer on the second surface of the second core substrate.

(17) Solder-resist layer 70 having opening 71 is formed on outermost resin insulation layers (150D) and conductive layers 258 (FIG. 7(A)). The conductive portion exposed through an opening of the solder resist works as terminal (260T).

(18) Nickel layer 72 and gold layer 74 are formed in openings 71 of the solder-resist layers (FIG. 7(B)). Second intermediate substrate 4000 is completed.

(19) The second intermediate substrate is cut along the (X2-X2) lines in FIG. 7(B) which are located inside copper foils 182 so that two core substrates are separated (FIG. 8A)). Printed wiring boards 10 are completed.

(20) Solder balls are loaded on terminals and pads exposed through openings 71 of the solder-resist layer, and a reflow is conducted. Solder bump (76B) is formed on terminal (260T) and solder bump (76A) is formed on a pad. Printed wiring board (10X) having solder bumps is completed (FIG. 9(A)).

IC chip 90 is mounted on printed wiring board 10 through solder bump (76A), and underfill 88 is filled between the printed wiring board and the IC chip. The printed wiring board is mounted on motherboard 96 through solder bump (76B) (FIG. 9(B)).

In the method for manufacturing a printed wiring board according to the first embodiment, two core substrates, namely, first and second core substrates (30A, 30B), are laminated and an upper buildup layer is formed on first surface (30F) of first core substrate 30 and first surface (30F) of second core substrate 30. During that time, upper buildup layers are formed to be symmetrical on the first surfaces of the first and second core substrates. Accordingly, even if the material of the inner resin insulation layer is different from the material of the outermost resin insulation layer, warping or undulation is slight in single-sided buildup substrates (BU1, BU2). Then, the first core substrate is separated from the second core substrate, and outermost resin insulation layer (150U) of the first core substrate is laminated to outermost resin insulation layer (150U) of the second core substrate. After that, a lower buildup layer is formed on second surface (30S) of the first core substrate and second surface (30S) of the second core substrate. The lower buildup layer formed on the first core substrate and the lower buildup layer formed on the second substrate have the same number of resin insulation layers and the same number of conductive layers. Therefore, lower buildup layers are formed to be symmetrical on the second surfaces of the first and second core substrates. When upper buildup layers are formed, stresses are offset since an upper buildup layer on the first core substrate and an upper buildup layer on the second core substrate are identical. Also, when lower buildup layers are formed, stresses are offset since a lower buildup layer on the first core substrate and a lower buildup layer on the second core substrate are identical. Therefore, even if the number of resin insulation layers and the number of conductive layers are different in the upper buildup layer and the lower buildup layer, printed wiring board 10 is obtained where warping or undulation is slight. In the same manner, even if the materials of resin insulation layers are different in the upper buildup layer and the lower buildup layer, printed wiring board 10 is obtained where warping or undulation is slight.

In addition, to mount an electronic component, a greater number of wiring lines in a fine pitch may be formed in the upper buildup layer. By contrast, since power lines and ground lines are integrated in the upper buildup layer, the number of wiring lines formed in the lower buildup layer may be smaller than the number of wiring lines formed in the upper buildup layer. By reducing the number of resin insulation layers and conductive layers in the lower buildup layer which has fewer wiring lines, manufacturing costs decrease. Moreover, the thickness of a printed wiring board is reduced, and electrical and thermal characteristics are improved. Furthermore, since buildup layers are formed while two core substrates are laminated, warping seldom occurs. Accordingly, the thickness of a core substrate is made half, making a printed wiring board thinner and improving its electrical and thermal characteristics.

Modified Example of the First Embodiment

Figure 10:
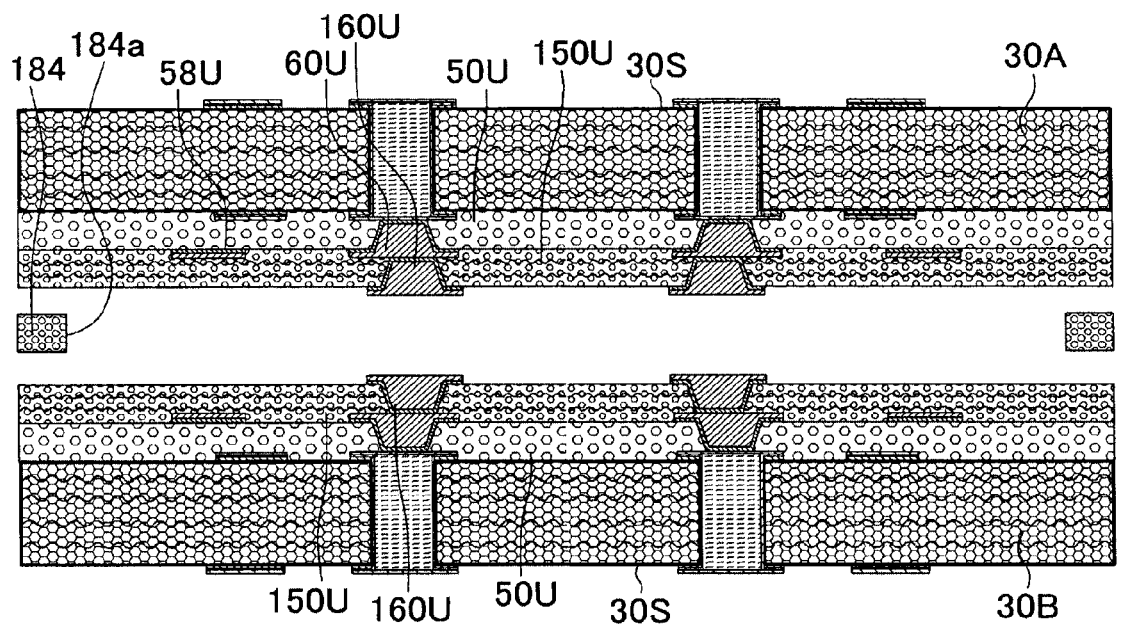
FIGS. 10(A)-10(B) are views of steps showing a method for manufacturing a printed wiring board according to a modified example of the first embodiment.
Figure 10:
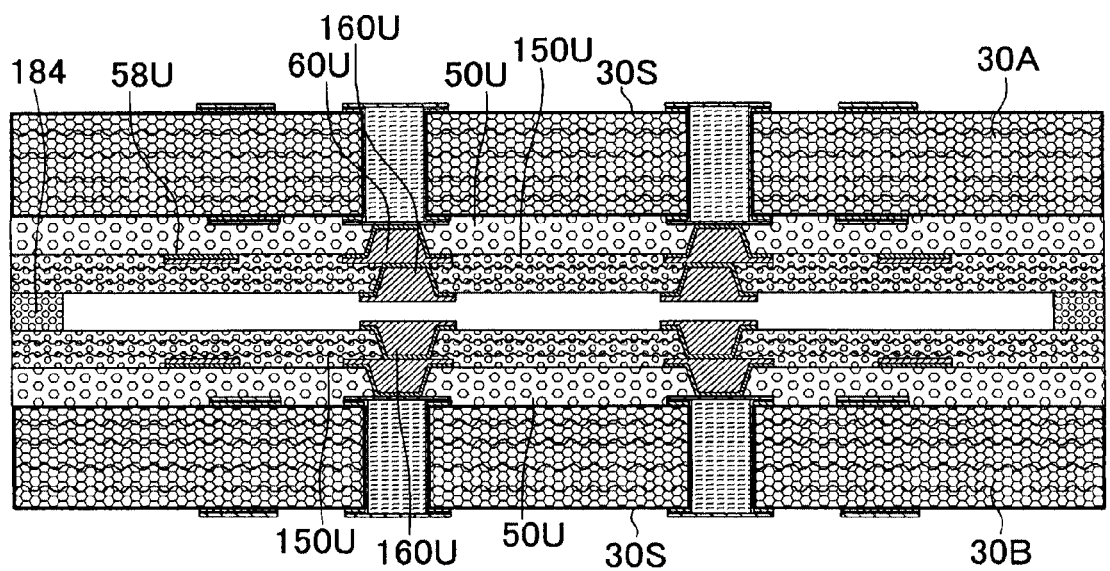
Figure 11:
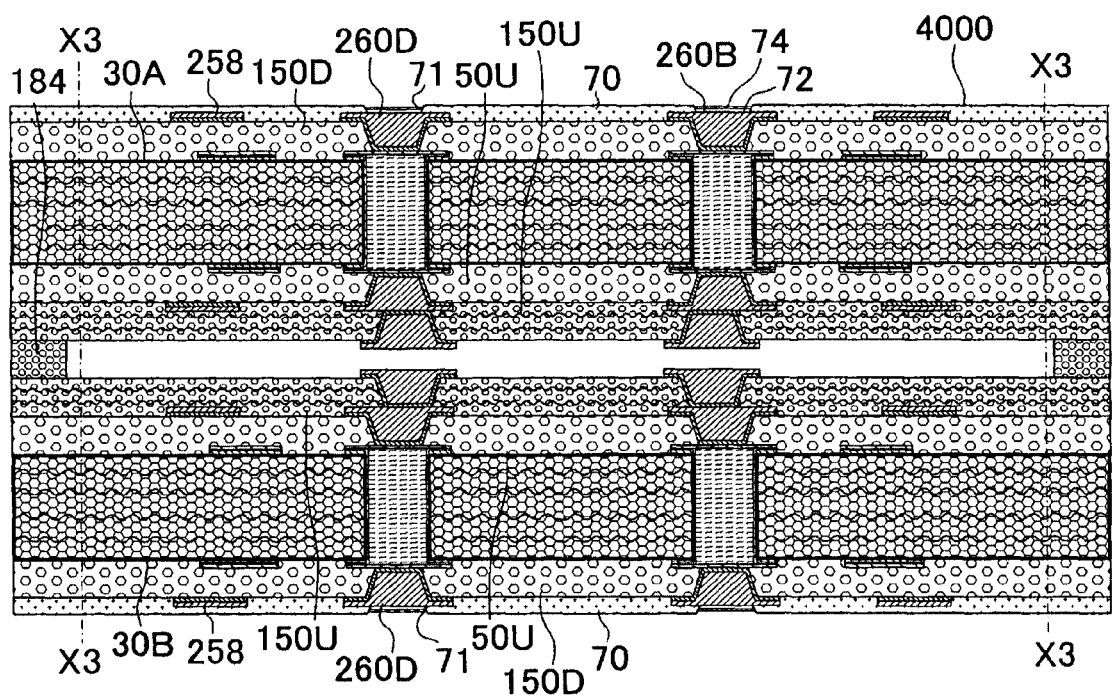
FIGS. 11(A)-11(B) are views of steps showing the method for manufacturing a printed wiring board according to the modified example of the first embodiment.
Figure 11:
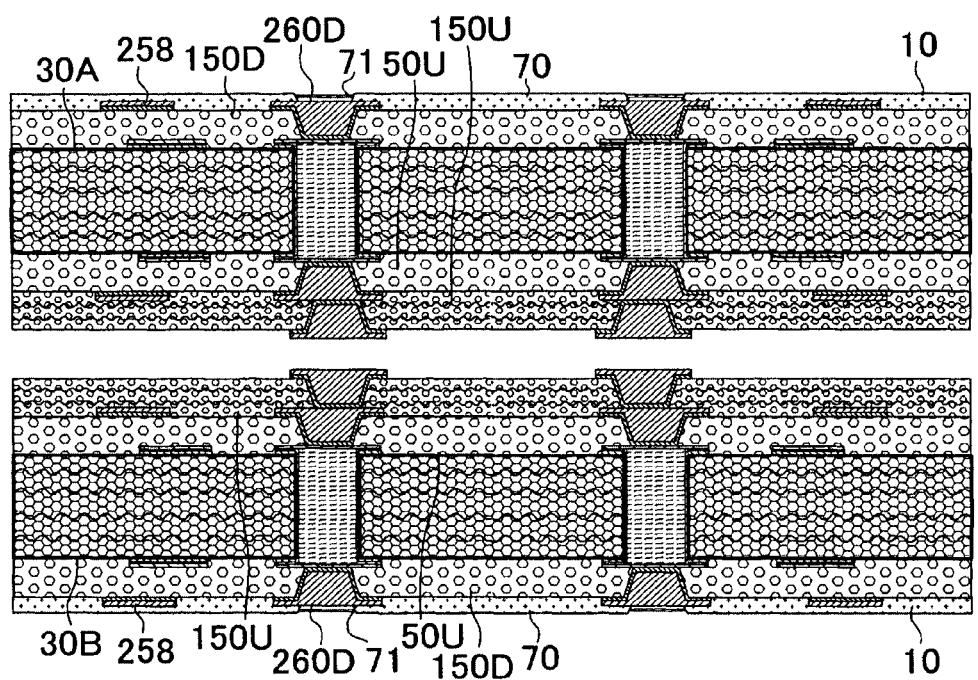
Figure 12:
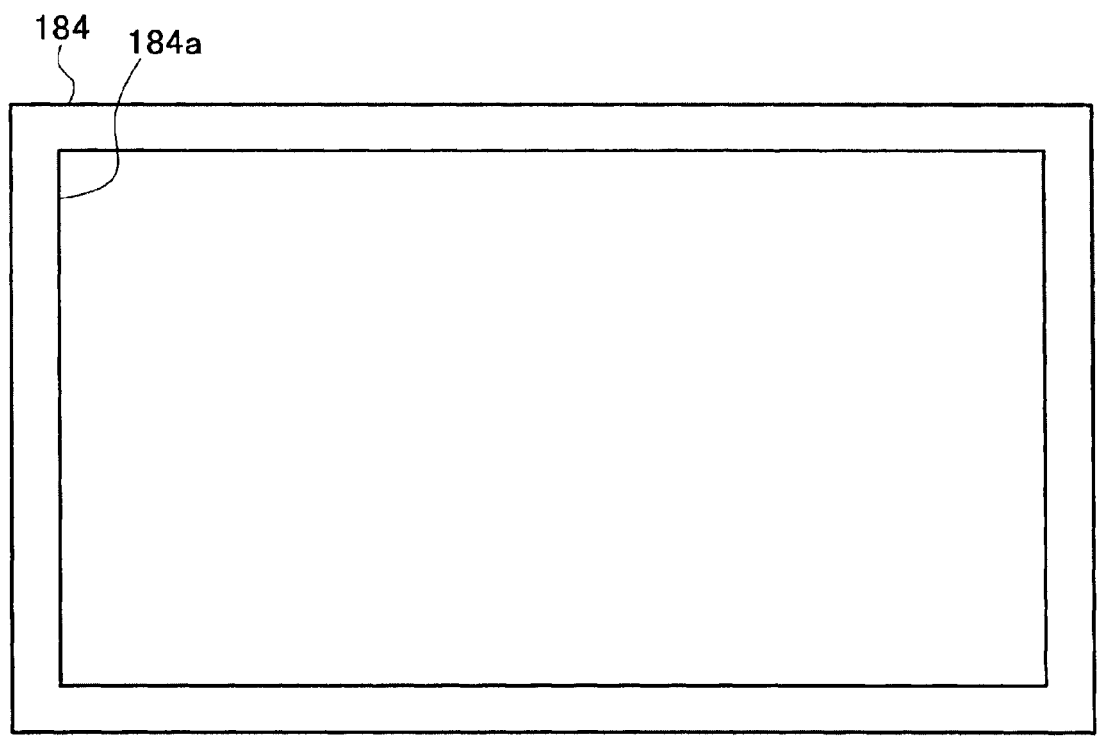
FIG. 12 is a plan view of a prepreg to be used in the modified example of the first embodiment.
Figure 13:
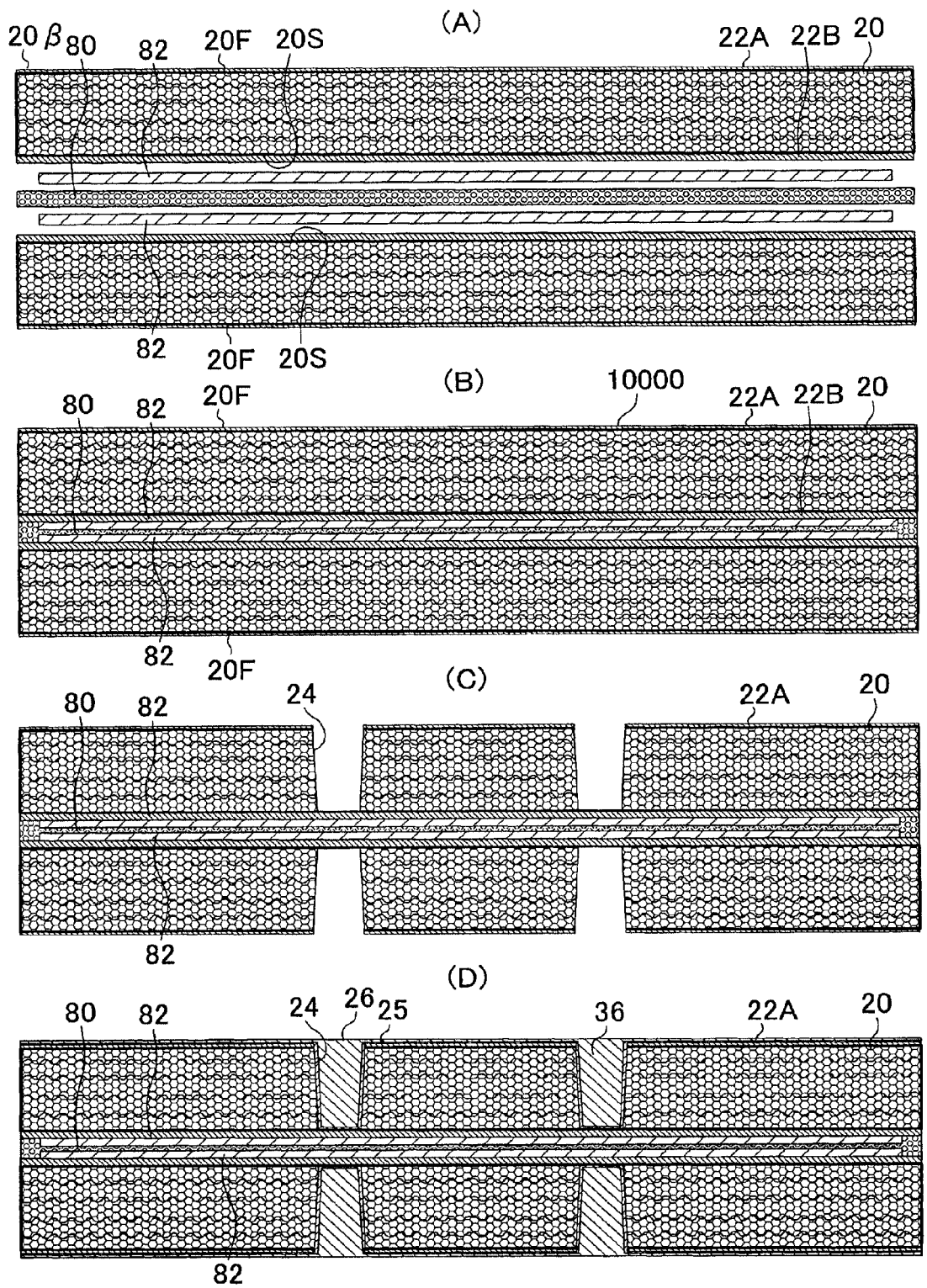
FIGS. 13(A)-13(D) are views of steps showing a method for manufacturing a printed wiring board according to a second embodiment.
Figure 14:
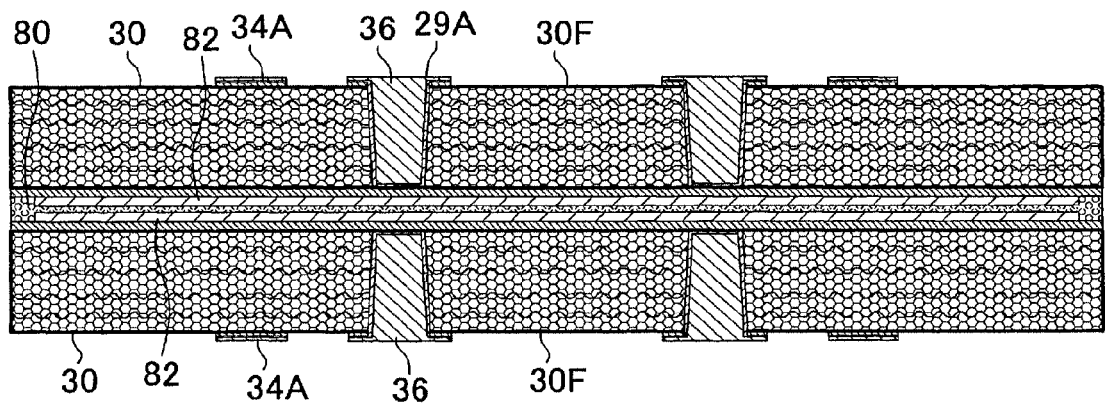
FIGS. 14(A)-14(C) are views of steps showing the method for manufacturing a printed wiring board according to the second embodiment.
Figure 14:
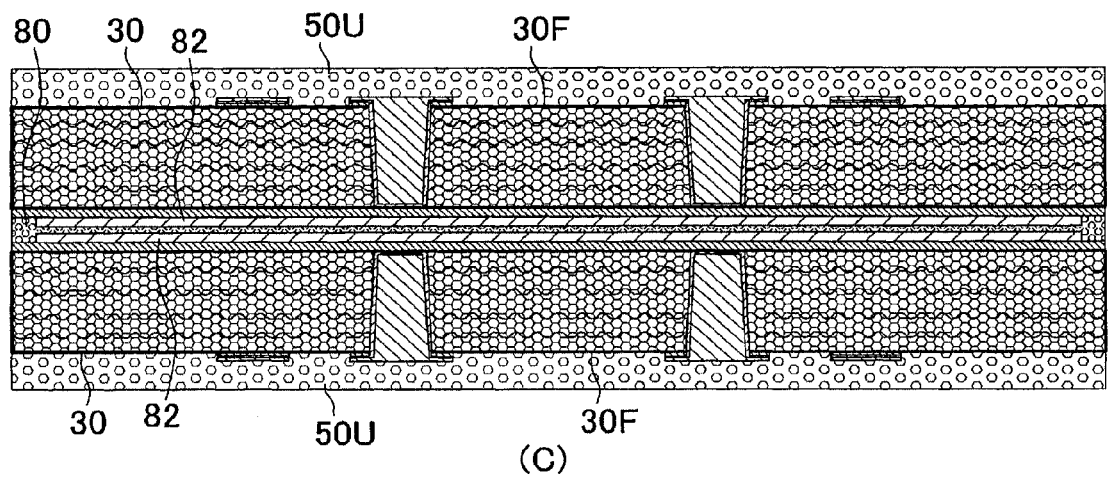
Figure 14:
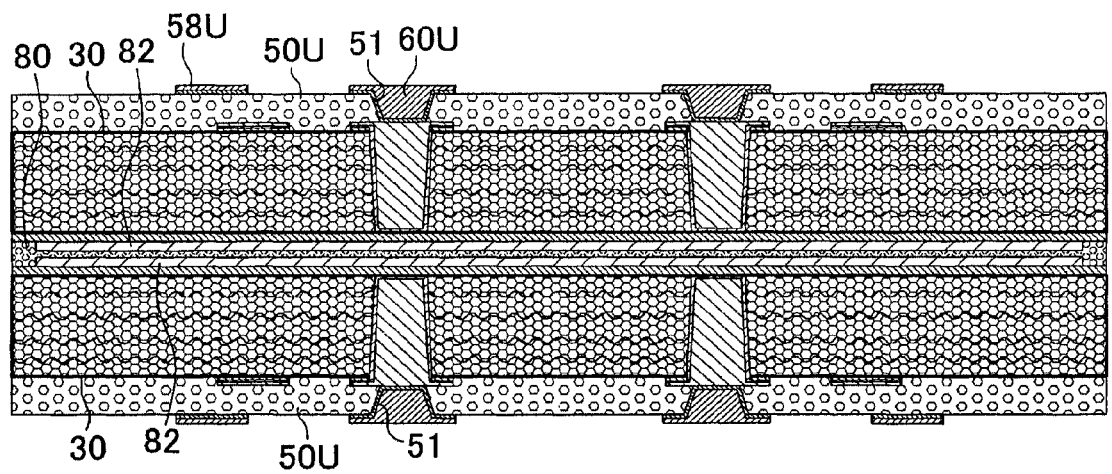
Figure 15:
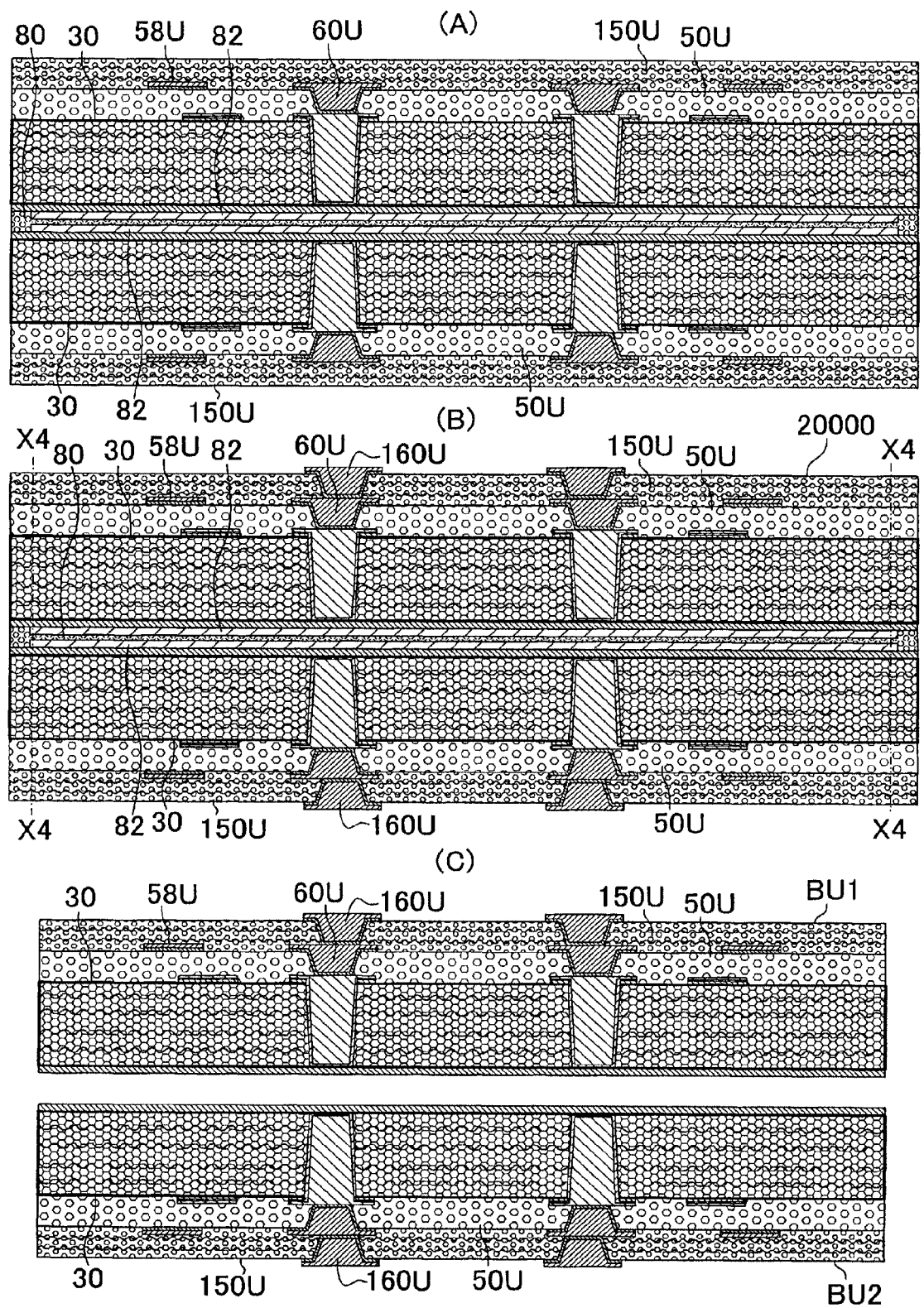
FIGS. 15(A)-15(C) are views of steps showing the method for manufacturing a printed wiring board according to the second embodiment.

FIGS. 10~12 show a method for manufacturing printed wiring board 10 according to a modified example of the first embodiment. Upper buildup layers are formed on core substrates 30 by the method shown in FIGS. 1~4, the same as in the first embodiment. Two single-sided buildup substrates are obtained the same as in the first embodiment.

(14) Prepreg 184 having opening (184a) in its center is prepared. Two single-sided buildup substrates are laminated to sandwich the prepreg in such a way that upper buildup layers face each other (FIG. 10(A)). A plan view of prepreg 184 is shown in FIG. 12. Conductive layers (158U) are positioned in opening (184a) during that time. There are no conductive circuits, via conductors or pads formed on outermost resin insulation layers which make contact with the prepreg. Then, thermal pressing is conducted so that two single-sided buildup substrates are laminated by prepreg 184 (FIG. 10(B)). The second surface of a core substrate is set in an outward direction. No copper foil is required.

Figure 6:
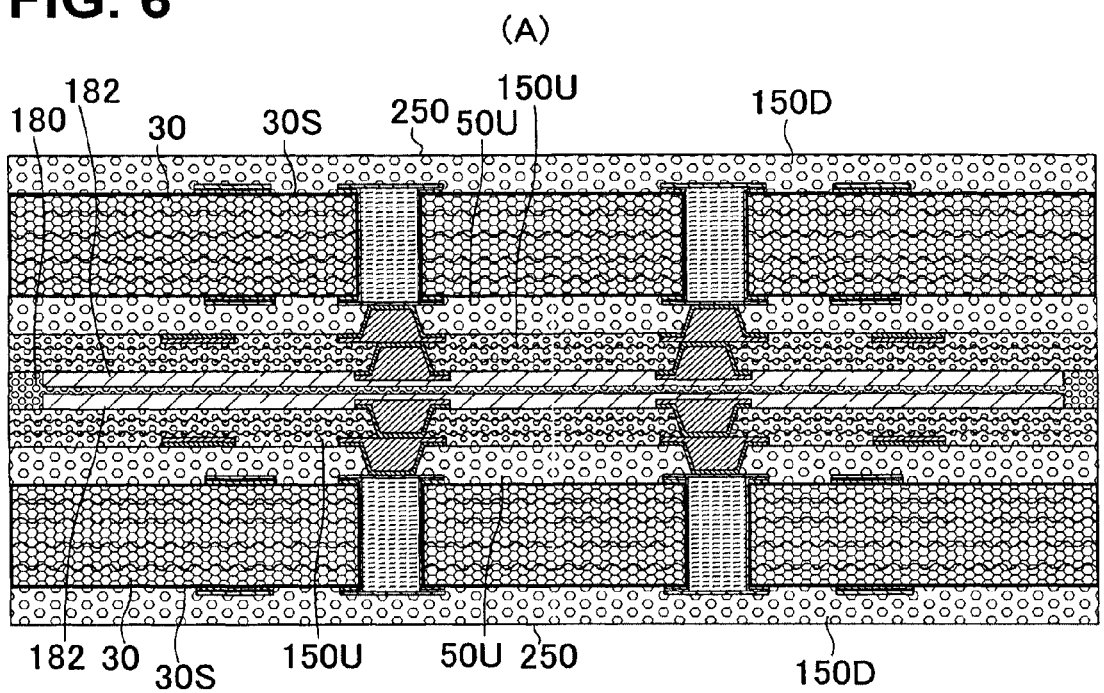
FIGS. 6(A)-6(B) are views of steps showing the method for manufacturing a printed wiring board according to the first embodiment.
Figure 6:
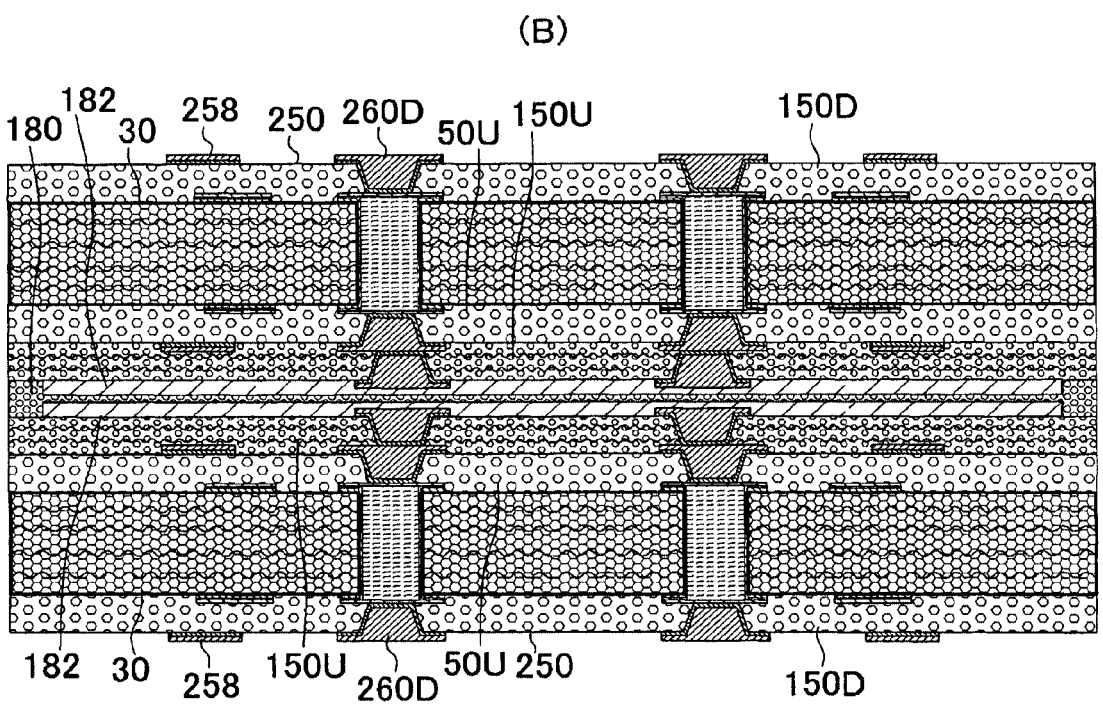
Figure 7:
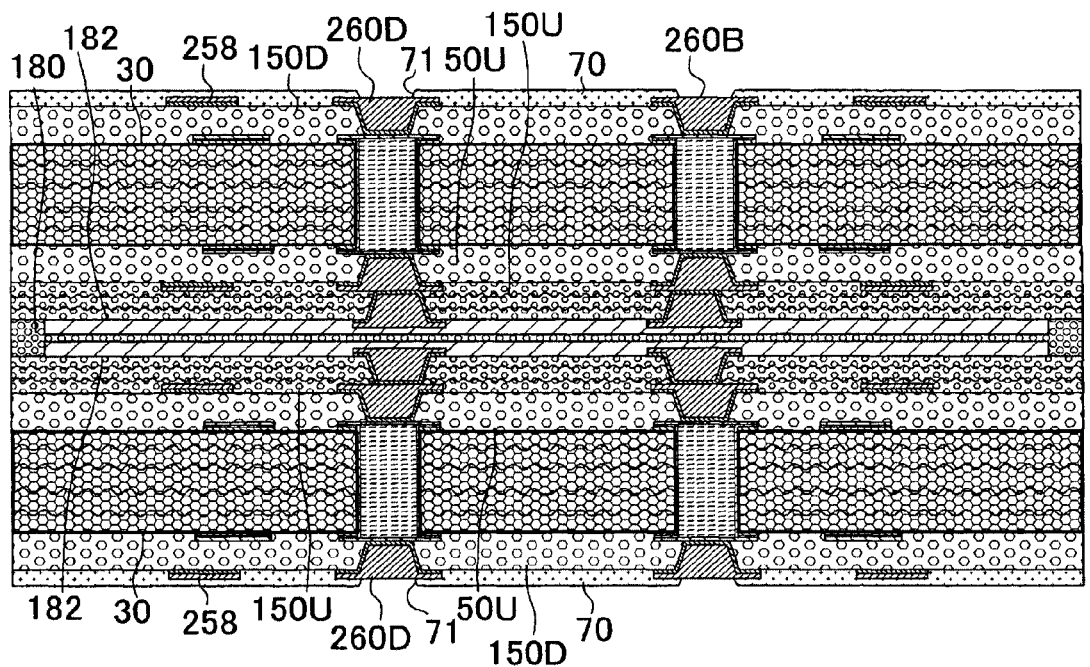
FIGS. 7(A)-7(B) are views of steps showing the method for manufacturing a printed wiring board according to the first embodiment.
Figure 7:
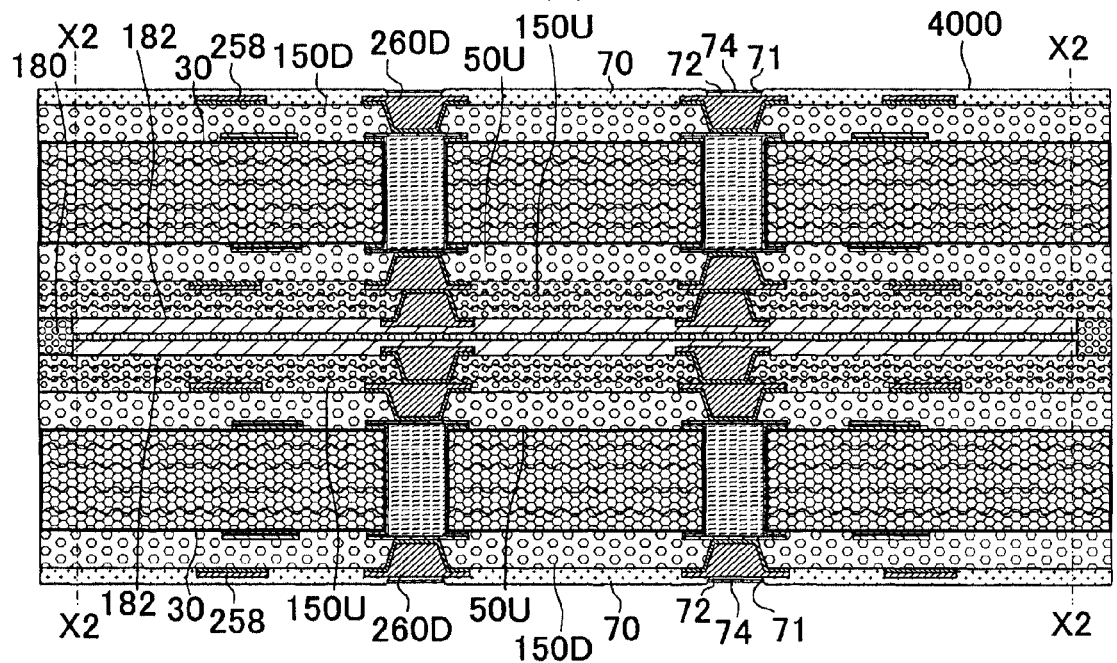

(15) A lower buildup layer and solder-resist layer are formed on second surfaces (30S) of both core substrates (30A, 30B) by the method shown in FIGS. 6~7. Then, nickel layer 72 and gold layer 74 are formed on terminals in openings 71 of the solder-resist layers (FIG. 11(A)). Second intermediate substrate 4000 is completed.

(19) Second intermediate substrate 4000 is cut along the (X3-X3) lines in FIG. 11(A) which are located inside opening (184a) of the prepreg so that two core substrates are separated (FIG. 11(B)). Two printed wiring boards 10 are completed. Since the subsequent steps are the same as those in the first embodiment, their descriptions are omitted here.

The material of each resin insulation layer in the modified example of the first embodiment is the same as that in the first embodiment. A printed wiring board obtained by the manufacturing method according to the modified example of the first embodiment shows the same effects as those in the first embodiment. Since upper and lower buildup layers are formed after core substrates are laminated in the manufacturing method according to the modified example of the first embodiment, the same effects as in the first embodiment are achieved in the modified example of the first embodiment.

Second Embodiment

FIGS. 13~20 show a method for manufacturing a printed wiring board according to a second embodiment of the present invention.

(1) Two copper-clad laminates (20β) are prepared, where copper foil is laminated on both surfaces of insulative substrate 20 with a thickness of 0.04~0.2 mm. Three μm-thick copper foil (22A) is laminated on first surface (20F) of insulative substrate 20 and 12 μm-thick copper foil (22B) on the second surface (20S). In addition, a sheet of prepreg 80 and two copper foils (82, 82) are prepared. The prepreg and copper clad laminates (20β) are substantially the same size, and copper foils 82 are smaller than the core substrates. However, the copper foils are larger than a predetermined size. The conductive layers on the core substrates are formed inside the area of the predetermined size. Copper foils (82, 82) are laminated on both surfaces of the prepreg. The prepreg is sandwiched by two copper foils (82, 82). The copper-clad laminates sandwich copper foils (82, 82) and prepreg 80 in such a way that second surfaces (30S) of two copper-clad laminates face each other (FIG. 13(A)). The peripheries of the copper clad laminates are exposed from the copper foils. Then, thermal pressing is conducted to laminate two copper-clad laminates by prepreg 80 (FIG. 13(B)). The copper-clad laminates are adhered to each other in areas exposed from the copper foils. Laminate 10000 is completed. First surface (20F) of a copper-clad laminate is set in an outward direction.

(2) Non-penetrating holes 24 that reach copper foils (22B) are formed in copper-clad laminates using a laser (FIG. 13(C)). The non-penetrating holes taper from the first surface of insulative substrate 20 toward the second surface. Electroless plating is performed to form electroless plated film 25 on the inner walls of the non-penetrating holes and the surfaces of copper foils (22A). Next, electrolytic plating is performed to form electrolytic plated film 26. Accordingly, through-hole conductor 36 is formed in non-penetrating hole 24 (FIG. 13(D)).

(3) Etching resist is formed on the first surfaces of insulative substrates 20, then plated films (25, 26) and copper foil 22 which are exposed from the etching resist are removed using an etching solution, and the etching resist is removed. Accordingly, conductive circuits (34A) and lands (29A) of through-hole conductors 36 are formed on first surfaces (20F) of the core substrates (FIG. 14(A)). Conductive layers are formed the same as in the first embodiment.

(4) Resin insulation layer (inner resin insulation layer) (50U) is formed on first surfaces (20F) of both core substrates (30, 30) (FIG. 14(B)).

(5) By treatments the same as (6)~(10) in the first embodiment, via conductors (60U) and conductive circuits (58U) are formed (FIG. 14(C)). Conductive layers are formed the same as in the first embodiment.

(6) Outermost resin insulation layer (150U) is formed on resin insulation layers 50 (FIG. 15A)).

(7) By treatments the same as (6)~(10) in the first embodiment, via conductors (160U) are formed (FIG. 15(B)). Conductive layers are formed the same as in the first embodiment. On surfaces of outermost resin insulation layers (150U), lands of via conductors are formed, but no conductive circuit is formed. Upper buildup layers are completed on the first surfaces of insulative substrates. Intermediate substrate 20000 is completed. Materials of inner resin insulation layer (50U) and outermost resin insulation layer (150U) in the second embodiment are the same as those in the first embodiment.

(8) Intermediate substrate 20000 is cut along the (X4-X4) lines in FIG. 15(B) which are located inside copper foils 82 so that two core substrates are separated (FIG. 15(C)). Two single-sided buildup substrates (BU1, BU2) are completed.

Figure 16:
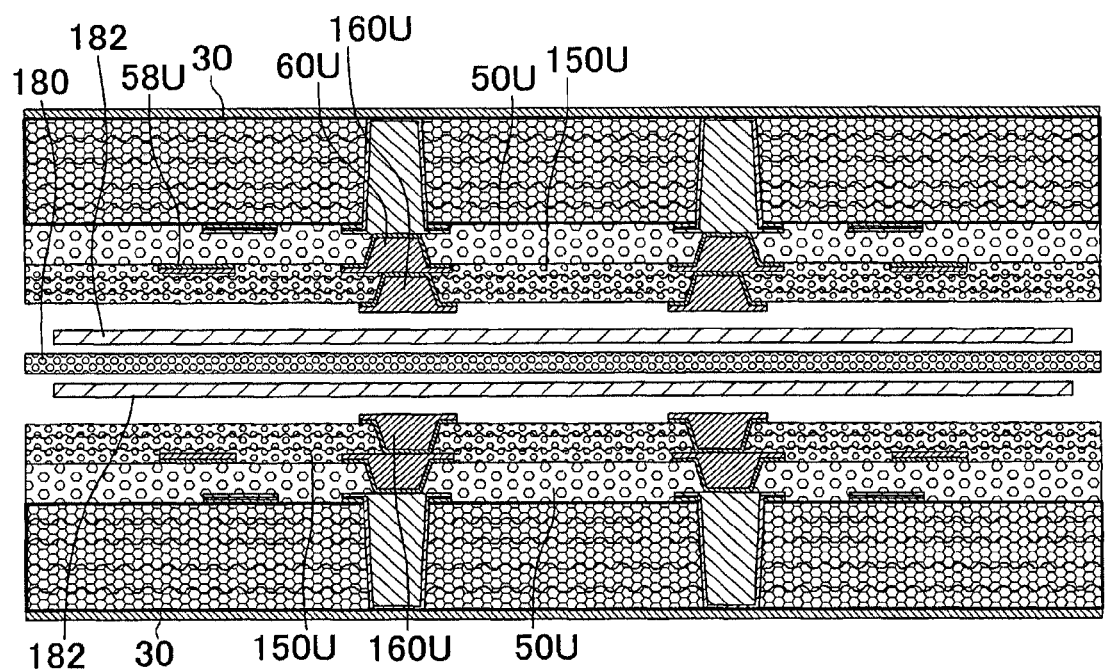
FIG. 16 is a view of steps showing the method for manufacturing a printed wiring board according to the second embodiment.
Figure 17:
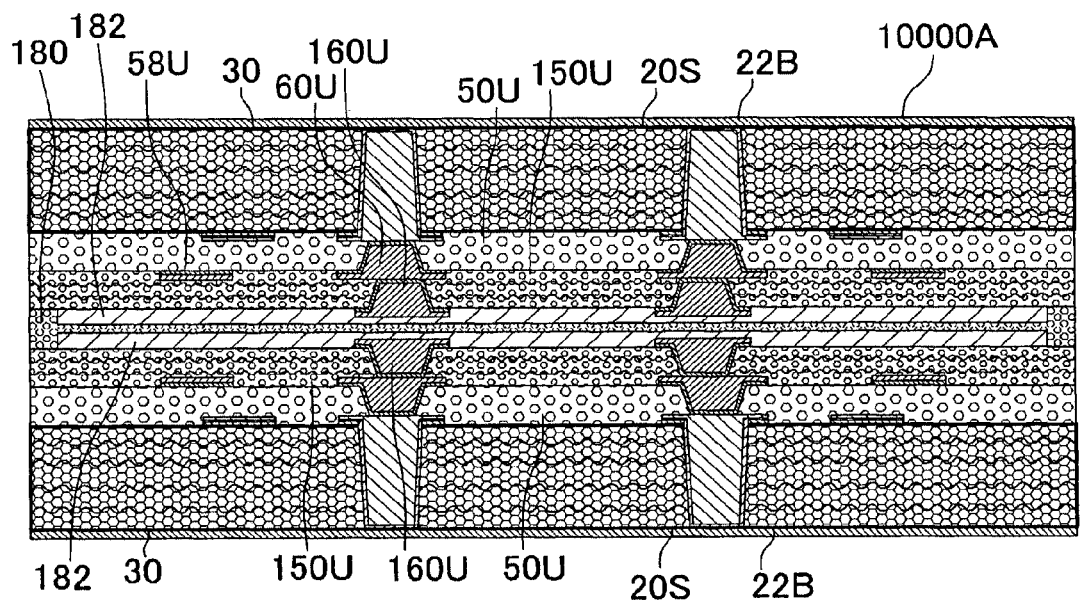
FIGS. 17(A)-17(B) are views of steps showing the method for manufacturing a printed wiring board according to the second embodiment.
Figure 17:
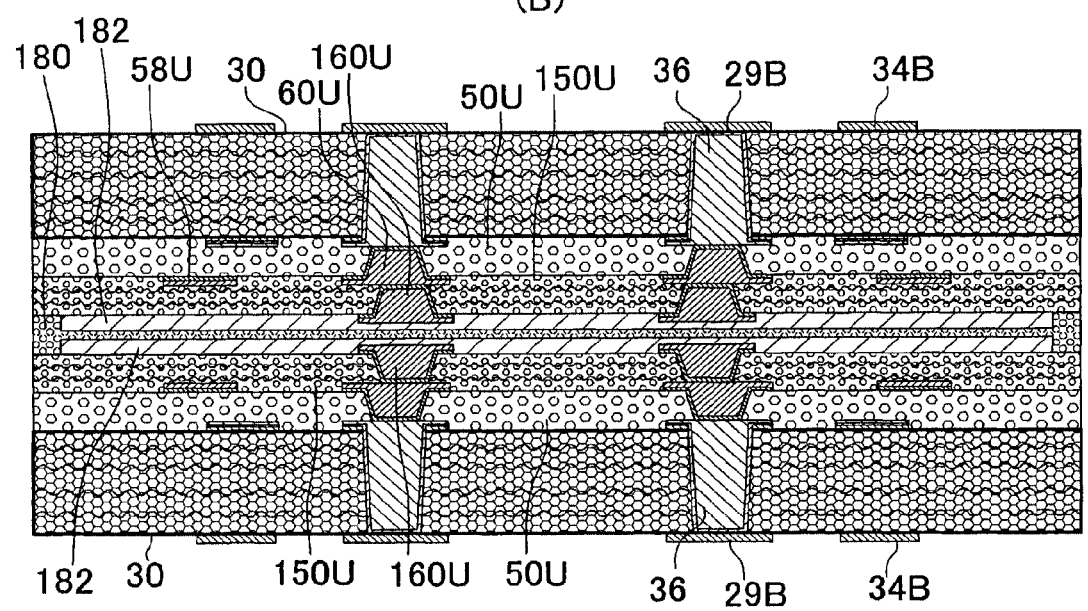
Figure 18:
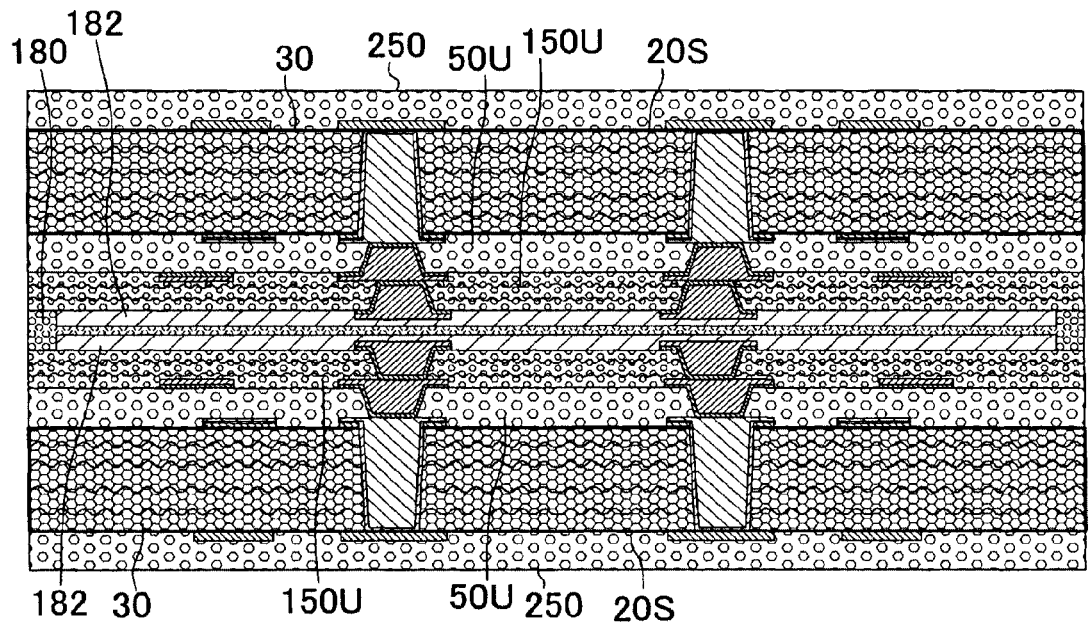
FIGS. 18(A)-18(B) are views of steps showing the method for manufacturing a printed wiring board according to the second embodiment.
Figure 18:
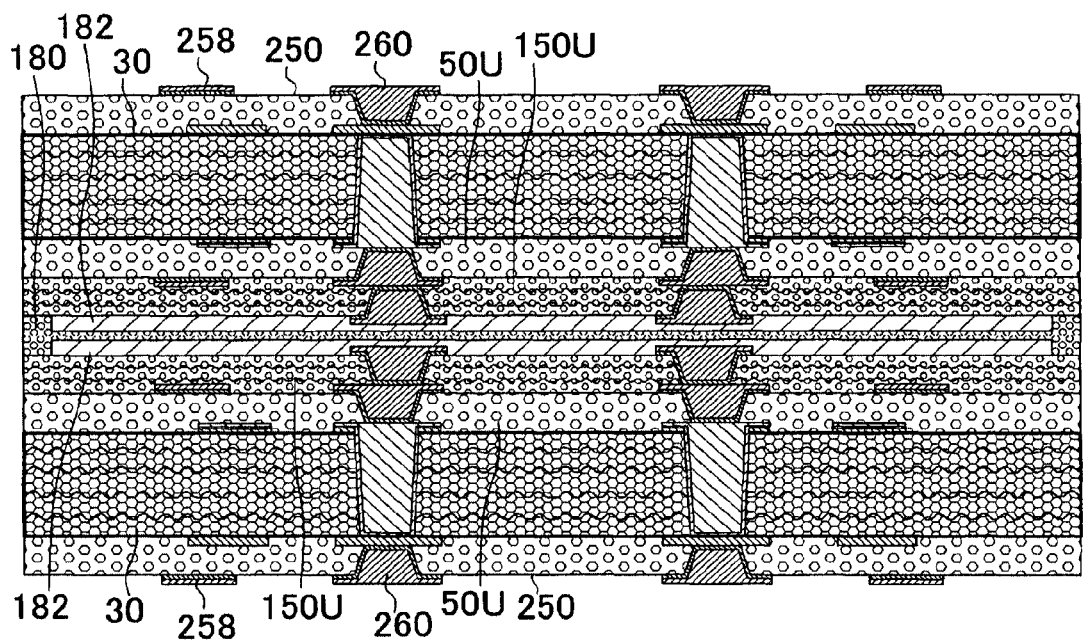
Figure 19:
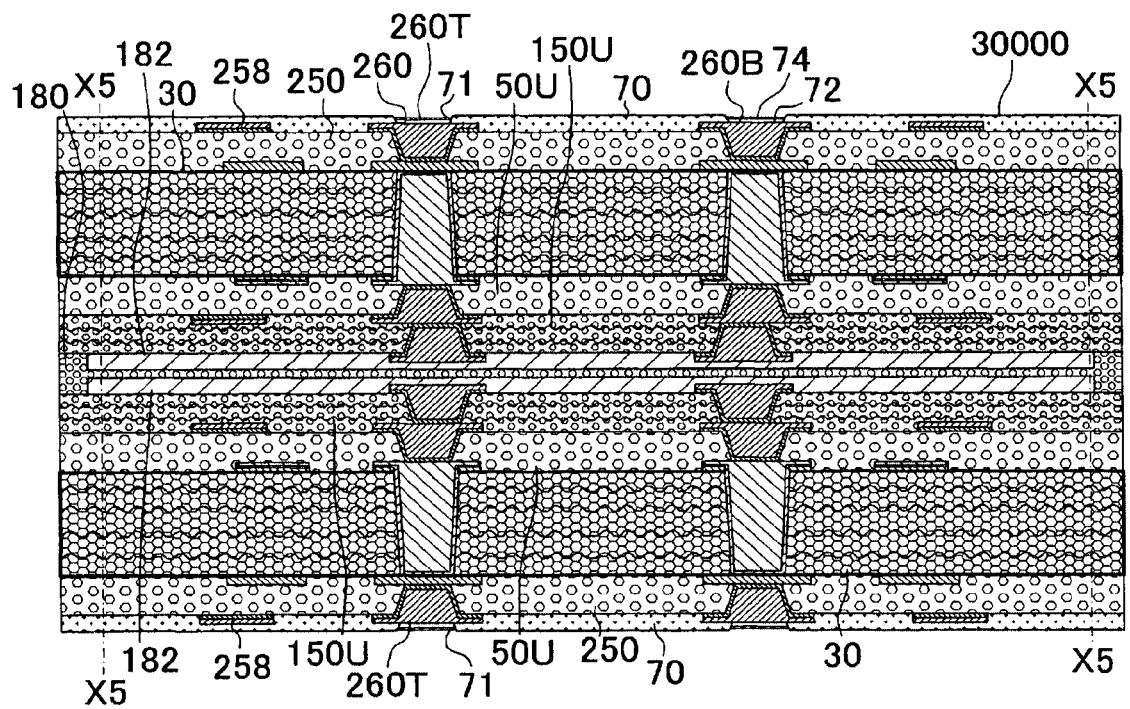
FIGS. 19(A)-19(B) are views of steps showing the method for manufacturing a printed wiring board according to the second embodiment.
Figure 19:
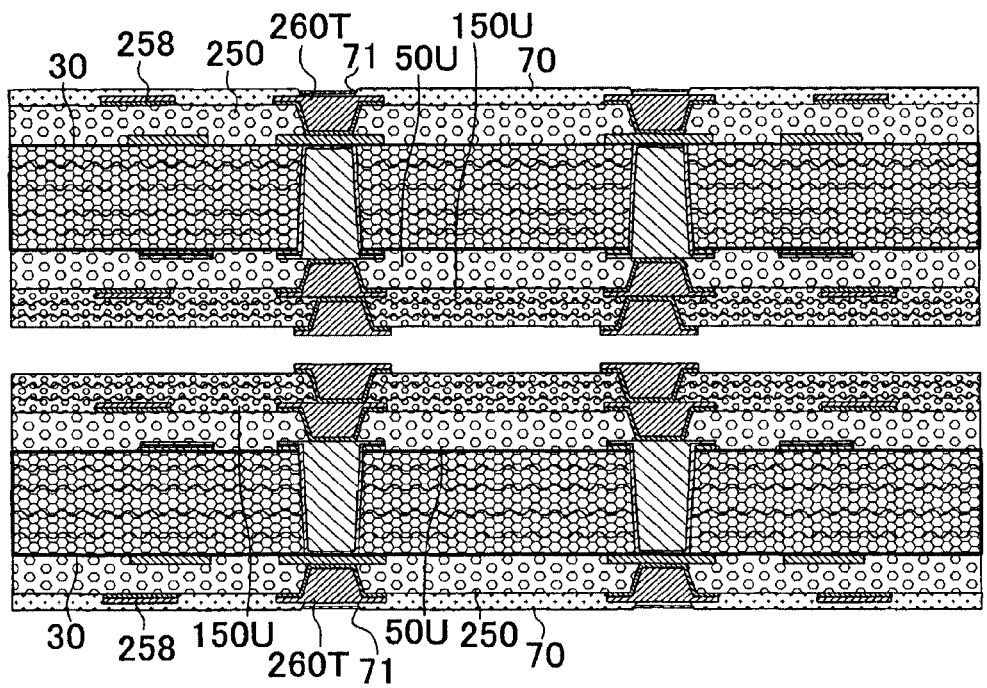
Figure 20:
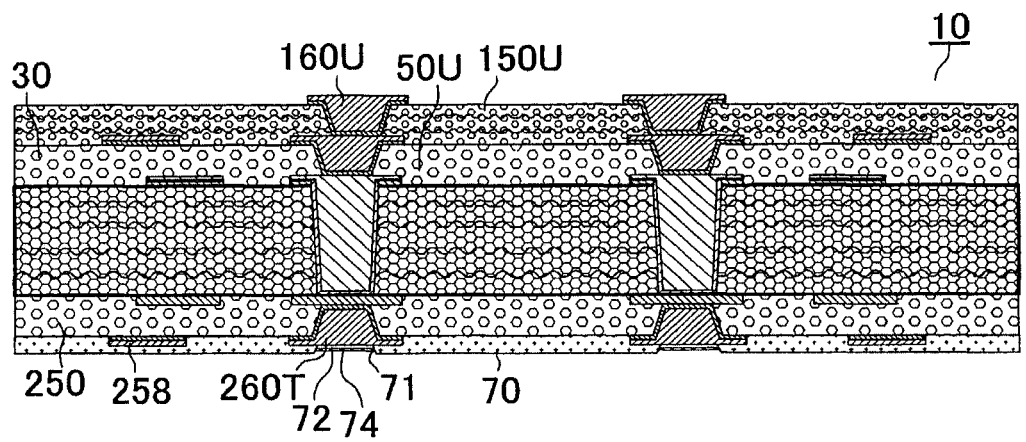
FIGS. 20(A)-20(B) are views showing a printed wiring board according to the second embodiment and its applied example.
Figure 20:
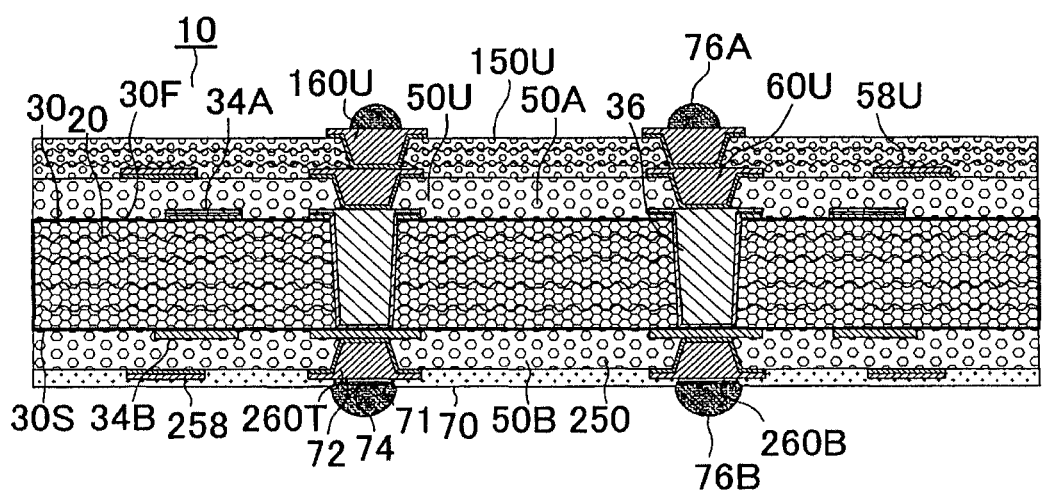

(9) A sheet of prepreg 180, two copper foils (182, 182), and two single-sided buildup substrates (BU1, BU2) are prepared. The prepreg and single-sided buildup substrates are substantially the same size, and copper foils 182 are smaller than single-sided buildup substrates. Two single-sided buildup substrates, two copper foils and a sheet of prepreg are laminated. The prepreg is sandwiched by two copper foils. Single-sided buildup substrates sandwich copper foils (182, 182) and prepreg 180 in such a way that the core substrates of two single-sided buildup substrates face each other (FIG. 16). Conductive layer (150U) is covered by copper foil 182, but the peripheral portion of the outermost resin insulation layer is exposed from the copper foil. The peripheries of outermost resin insulation layers are left exposed by copper foils. Then, thermal pressing is conducted to laminate two single-sided buildup substrates by prepreg 180 (FIG. 17(A)). Outermost resin insulation layers exposed from copper foils are adhered to each other by the prepreg. Second laminate (1000A) is completed. The second surface of a core substrate is set in an outward direction.

(10) Copper foils (22B) on second surfaces (30S) of core substrates are etched to have a predetermined pattern so that conductive circuits (34B) and lands (29B) of through-hole conductors 36 are formed on second surfaces of insulative substrates (FIG. 17B)). Conductive layers are formed on core substrates.

(11) Resin insulation layer 250 is formed on second surfaces (20S) of both core substrates (30, 30) (FIG. 18(A)).

(12) By treatments the same as (6)~(10) in the first embodiment, via conductors 260 and conductive circuits 258 are formed (FIG. 18(B)). Lower buildup layers are completed on second surfaces of insulative substrates.

(13) Solder-resist layer 70 having opening 71 is formed on the lower buildup layers. The conductive portion exposed through an opening of solder resist works as terminal (260T). Nickel layer 72 and gold layer 74 are formed on the terminals in openings 71 of the solder-resist layers (FIG. 19A)). Second intermediate substrate 30000 is completed.

(14) The second intermediate substrate is cut along the (X5-X5) lines in FIG. 19(A) which are located inside copper foils 182 so that two core substrates are separated (FIG. 19(B)). Two printed wiring boards 10 are completed. Printed wiring boards obtained by the manufacturing method according to the second embodiment show the same effects as in the first embodiment (FIG. 20(A)).

(15) Solder bumps (76A, 76B) are formed on terminals and pads. A printed wiring board having solder bumps is completed (FIG. 20(B)).

The prepreg used for adhesion in each embodiment is preferred to be a low-flow type. Since upper and lower buildup layers are also formed after core substrates are laminated in the manufacturing method according to the second embodiment, the same effects are achieved in the second embodiment as in the first embodiment. In each embodiment, the number of resin insulation layers in an upper buildup layer is preferred to be greater than the number of resin insulation layers in a lower buildup layer. A solder-resist layer is formed on the lower buildup layer. There is no solder-resist layer formed on the upper buildup layer. Accordingly, warping or undulation is slight in the second intermediate substrate. Cutting accuracy is high in the second intermediate substrate. The dimensional accuracy of a printed wiring board is high. In each embodiment, the difference is preferred to be one between the number of resin insulation layers in the first buildup layer and the number of resin insulation layers in the second buildup layer. Warping is made slight in the printed wiring board.

In each embodiment, conductive circuits may be formed on the outermost resin insulation layer of an upper buildup layer.

In such a case, a solder-resist layer having an opening to expose a pad is formed on the upper buildup layer. The solder-resist layers on the upper buildup layers are laminated to each other in such a case. By following the same steps as those in each embodiment for the subsequent procedure, a printed wiring board is formed.

EXAMPLE

Copper-clad laminate (20α) is prepared, where 3 μm-thick copper foil 22 is laminated on both surfaces of 0.06 mm-thick insulative substrate 20 (FIG. 1(A)). The insulative substrate has first surface (30F) and second surface (30S) opposite the first surface. In addition, the insulative substrate is formed with glass cloth made of E-glass, epoxy resin and silica particles.

Figure 22:
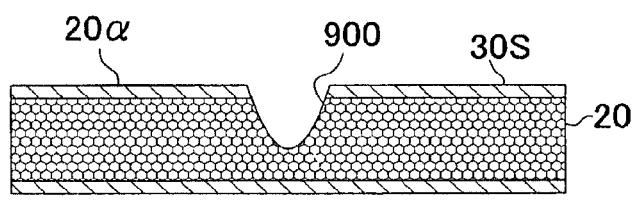
FIGS. 22(A)-22(C) are views showing a method for manufacturing a core substrate and the core substrate.
Figure 22:
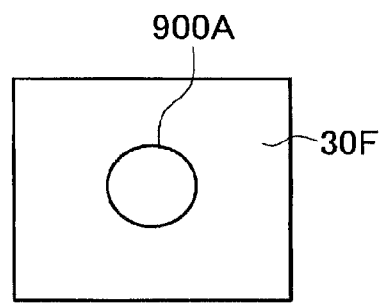
Figure 22:
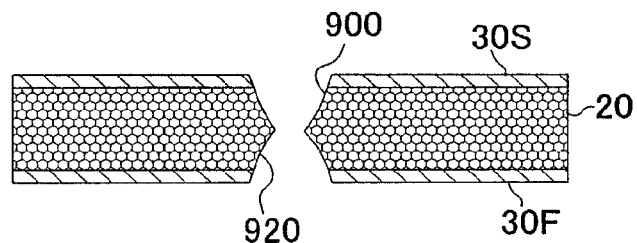
Figure 22:
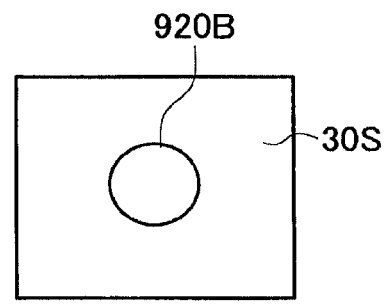
Figure 22:
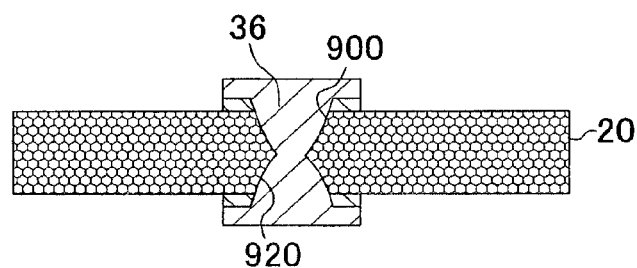

A carbon-dioxide gas laser is irradiated at copper-clad laminate (20α) from the first-surface side of the insulative substrate. First opening 900 tapering gradually from the first surface of the insulative substrate toward the second surface is formed in copper-clad laminate (20α). First surface 900 has first opening portion (900A) on the first surface of the insulative substrate (FIG. 22(A)). A carbon-dioxide gas laser is irradiated at copper-clad laminate (20α) from the second-surface side of the insulative substrate. The position to be irradiated is related to the position where first opening 900 is formed. Second opening 920 tapering gradually from the second surface of the insulative substrate toward the first surface is formed in copper-clad laminate (20α). A penetrating hole is formed by connecting first opening 900 and second opening 920 in copper-clad laminate (20α). Second opening 920 has second opening portion (920B) on the second surface of the insulative substrate (FIG. 22(B)). First opening portion (900A) is opposite second opening portion (920B). Electroless plated film is formed on the inner wall of the penetrating hole and on surfaces of copper-clad laminate (20α) as a seed layer. As for electroless plated film, electroless copper-plated film and electroless nickel-plated film may be listed. Electroless copper-plated film is formed in the example. Electrolytic plated film is formed on the seed layer. During that time, the penetrating hole is filled with electrolytic plated film to form a through-hole conductor. As for electrolytic plated film, electrolytic copper-plated film and electrolytic nickel-plated film may be listed. Electrolytic copper-plated film is formed in the example. A commercially available dry film is laminated on both surfaces of insulative substrate 20 to form etching resists 27 (FIG. 1(D)).

Portions of plated films (25, 26) and copper foil 22 exposed from etching resists 27 are removed using an etching solution, and etching resists 27 are removed. Accordingly, conductive layers (22U, 22D) are formed on the insulative substrate (FIG. 1(E)). Conductive layers (22U, 22D) include lands 29 of through-hole conductor 36.

A sheet of prepreg 80, two core substrates (first core substrate and second core substrate) (30, 30) and two copper foils 82 are prepared. The thickness of the prepreg is 60 μm and the thickness of the copper foil is 12 μm. The prepreg and core substrates are substantially the same size, and copper foils 82 are smaller than the core substrates. Copper foils (82, 82) are laminated on both surfaces of the prepreg, and core substrates are laminated on the copper foils (FIG. 1(F)). Second surfaces (30S) of two core substrates face each other.

Thermal pressing is conducted to laminate two core substrates by prepreg 80 (FIG. 2(A)). Insulative substrates exposed from the copper foils are adhered by the prepreg. The width to be bonded is approximately 2 mm. Laminate (100L) is completed. The first surface of a core substrate is set in an outward direction. Inner resin insulation layer (50U) is formed on first surfaces (30F) of both core substrates (30, 30) (FIG. 2(B)). Inner resin insulation layer (50U) is made of silica particles and epoxy resin. The average particle diameter of silica particles is 5 μm.

A laser is used to form openings 51 in inner resin insulation layers (50U) (FIG. 2(C)). Then, surfaces of resin insulation layers are roughened (not shown in the drawings). Electroless copper-plated film 52 is formed on surfaces of inner resin insulation layers 50 and openings 51 (FIG. 2(D)). Plating resist 54 with a predetermined pattern is formed on electroless copper-plated film 52 (FIG. 3(A)).

Electrolytic copper-plated film 56 is formed on electroless copper-plated film exposed from the plating resist (FIG. 3(B)). The plating resist is removed, and electroless plated film 52 between portions of electrolytic plated film 56 is etched away and via conductors (60U) and conductive circuits (58U) are formed (FIG. 3(C)). Outermost resin insulation layer (150U) is formed on inner resin insulation layers (50U) (FIG. 4(A)). Outermost resin insulation layer (150U) is formed with silica particles, glass cloth made of S-glass, and epoxy resin.

By treatments the same as (6)~(10) shown in the first embodiment, via conductors (160U) are formed (FIG. 4(B)). On surfaces of outermost resin insulation layers, lands of via conductors are formed but no conductive circuit is formed. A pad made of a via conductor and a land is formed. The intermediate substrate is cut along the (X1-X1) lines in FIG. 4(B) which are located inside copper foils 82 (FIG. 4(C)). Two single-sided buildup substrates are obtained.

A sheet of prepreg, two copper foils, and two single-sided buildup substrates are prepared. The thickness of prepreg is 60 μm, and the thickness of copper foil is 12 μm. The prepreg and single-sided buildup substrates are substantially the same size, and copper foils 82 are smaller than single-sided buildup substrates. As shown in FIG. 5(A), two single-sided buildup substrates, two copper foils and a sheet of prepreg are laminated (FIG. 5(A)). Thermal pressing is conducted and two single-sided buildup substrates are laminated by prepreg 80 (FIG. 5(B)).

Outermost resin insulation layers exposed from copper foils are adhered to each other by prepreg. Second laminate 3000 is completed. The second surface of a core substrate is set in an outward direction. Resin insulation layer (150D) is formed on second surfaces (30S) of both core substrates (30, 30) (FIG. 6(A)). Resin insulation layer 250 is formed with epoxy resin and silica particles. By treatments the same as (6)~(10) shown in the first embodiment, via conductor (260D) and conductive circuit 258 are formed (FIG. 6(B)).

Solder-resist layer 70 having opening 71 is formed on outermost resin insulation layers (150D) and conductive layers 258 (FIG. 7(A)). The conductive portion exposed through an opening of the solder resist works as terminal (260T). Nickel layer 72 and gold layer 74 are formed in openings 71 in solder-resist layers (FIG. 7(B)). Second intermediate substrate 4000 is completed.

The second intermediate substrate is cut along the (X2-X2) lines in FIG. 7(B) which are located inside copper foils 82 (FIG. 8A)). Printed wiring board 10 is completed (FIG. 8(B)). The same core substrate is used in the first embodiment and a modified example of the first embodiment. Namely, a core substrate having through-hole conductor 36 (see FIG. 22(C)) in an hourglass shape may be used in the first embodiment and a modified example of the first embodiment.

A method for manufacturing a printed wiring board according to one aspect of the present invention includes the following: preparing a first core substrate having a first surface and a second surface opposite the first surface and a second core substrate having a first surface and a second surface opposite the first surface; laminating the first core substrate and the second core substrate in such way that the second surface of the first core substrate faces the second surface of the second core substrate; forming an upper buildup layer on the first surface of the first core substrate and on the first surface of the second core substrate; separating the first core substrate from the second core substrate; laminating the upper buildup layer formed on the first core substrate and the upper buildup layer formed on the second core substrate; forming a lower buildup layer on the second surface of the first core substrate and on the second surface of the second core substrate; and separating the first core substrate from the second core substrate.

A printed wiring board according to another aspect of the present invention has the following: a core substrate having a first surface and a second surface opposite the first surface; an upper buildup layer formed on the first surface of the core substrate and having an outermost resin insulation layer; and a lower buildup layer formed on the second surface of the core substrate and having an outermost resin insulation layer. In such a printed wiring board, the material of the outermost resin insulation layer of the upper buildup layer is different from that of the outermost resin insulation layer of the lower buildup layer.

A printed wiring board according to yet another aspect of the present invention has the following: a core substrate having a first surface and a second surface opposite the first surface; an upper buildup layer formed on the first surface of the core substrate and having two or more resin insulation layers; and a lower buildup layer formed on the second surface of the core substrate and having one or more resin insulation layers. In such a printed wiring board, the number of resin insulation layers in the upper buildup layer is greater than the number of resin insulation layers in the lower buildup layer.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
laminating a first core substrate having a through-hole conductor formed through the first core substrate and a second core substrate having a through-hole conductor formed through the second core substrate;
forming a first upper buildup layer on a surface of the first core substrate;
forming a second upper buildup layer on a surface of the second core substrate;
separating the first core substrate and the second core substrate from each other;
laminating the first upper buildup layer formed on the first core substrate and the second upper buildup layer formed on the second core substrate;
forming a first lower buildup layer on an opposite surface of the first core substrate;
forming a second lower buildup layer on an opposite surface of the second core substrate; and
separating the first upper buildup layer and the second upper buildup layer,
wherein the forming of the first upper buildup layer comprises forming a plurality of resin insulation layers, the forming of the second upper buildup layer comprises forming a plurality of resin insulation layers, the forming of the first lower buildup layer comprises forming at least one resin insulation layer, the forming of the second lower buildup layer comprises forming at least one resin insulation layer, the plurality of insulation layers in the first upper buildup layer has a greater number of layers than the at least one resin insulation layer in the first lower buildup layer, the plurality of insulation layers in the second upper buildup layer has a greater number of layers than the at least one resin insulation layer in the second lower buildup layer, the first upper buildup layer has an outermost resin insulation layer comprising a material different from a material of an outermost resin insulation layer of the first lower buildup layer, the second upper buildup layer has an outermost resin insulation layer comprising a material different from a material of an outermost resin insulation layer of the second lower buildup layer, the outermost resin insulation layer of the first upper buildup layer has a thermal expansion coefficient which is lower than a thermal expansion coefficient of the first core substrate, the outermost resin insulation layer of the first lower buildup layer has a thermal expansion coefficient which is higher than a thermal expansion coefficient of the first core substrate, the outermost resin insulation layer of the second upper buildup layer has a thermal expansion coefficient which is lower than a thermal expansion coefficient of the second core substrate, the outermost resin insulation layer of the second lower buildup layer has a thermal expansion coefficient which is higher than a thermal expansion coefficient of the second core substrate, the outermost resin insulation layer of the first lower buildup layer does not have a reinforcing material, and the outermost resin insulation layer of the second lower buildup layer does not have a reinforcing material.

2. A method for manufacturing a printed wiring board, comprising:
laminating a first core substrate having a through-hole conductor formed through the first core substrate and a second core substrate having a through-hole conductor formed through the second core substrate;
forming a first upper buildup layer on a surface of the first core substrate;
forming a second upper buildup layer on a surface of the second core substrate;
separating the first core substrate and the second core substrate from each other;
laminating the first upper buildup layer formed on the first core substrate and the second upper buildup layer formed on the second core substrate;
forming a first lower buildup layer on an opposite surface of the first core substrate;
forming a second lower buildup layer on an opposite surface of the second core substrate; and
separating the first upper buildup layer and the second upper buildup layer,
wherein the first upper buildup layer has an outermost resin insulation layer comprising a material different from a material of an outermost resin insulation layer of the first lower buildup layer, the second upper buildup layer has an outermost resin insulation layer comprising a material different from a material of an outermost resin insulation layer of the second lower buildup layer, the outermost resin insulation layer of the first upper buildup layer has a thermal expansion coefficient which is lower than a thermal expansion coefficient of the first core substrate, the outermost resin insulation layer of the first lower buildup layer has a thermal expansion coefficient which is higher than a thermal expansion coefficient of the first core substrate, the outermost resin insulation layer of the second upper buildup layer has a thermal expansion coefficient which is lower than a thermal expansion coefficient of the second core substrate, the outermost resin insulation layer of the second lower buildup layer has a thermal expansion coefficient which is higher than a thermal expansion coefficient of the second core substrate, the outermost resin insulation layer of the first lower buildup layer does not have a reinforcing material, and the outermost resin insulation layer of the second lower buildup layer does not have a reinforcing material.

3. The method for manufacturing a printed wiring board according to claim 2, wherein the outermost resin insulation layer of the first upper buildup layer has a reinforcing material, the first core substrate has a reinforcing material, the reinforcing material in the outermost resin insulation layer of the first upper buildup layer has a thermal expansion coefficient which is lower than a thermal expansion coefficient of the reinforcing material in the first core substrate, the outermost resin insulation layer of the second upper buildup layer has a reinforcing material, the second core substrate has a reinforcing material, and the reinforcing material in the outermost resin insulation layer of the second upper buildup layer has a thermal expansion coefficient which is lower than a thermal expansion coefficient of the reinforcing material in the second core substrate material.

4. The method for manufacturing a printed wiring board according to claim 1, wherein the forming of the first upper buildup layer includes forming a pad configured to mount a semiconductor element, and the forming of the second upper buildup layer includes forming a pad configured to mount a semiconductor element.

5. The method for manufacturing a printed wiring board according to claim 1, further comprising forming a solder-resist layer on at least one of the first lower buildup layer and the second lower buildup layer.

6. A method for manufacturing a printed wiring board,
laminating a first core substrate having a through-hole conductor formed through the first core substrate and a second core substrate having a through-hole conductor formed through the second core substrate;
forming a first upper buildup layer on a surface of the first core substrate;
forming a second upper buildup layer on a surface of the second core substrate;
separating the first core substrate and the second core substrate from each other;
laminating the first upper buildup layer formed on the first core substrate and the second upper buildup layer formed on the second core substrate;
forming a first lower buildup layer on an opposite surface of the first core substrate;
forming a second lower buildup layer on an opposite surface of the second core substrate; and
separating the first upper buildup layer and the second upper buildup layer,
wherein the laminating of the first core substrate and the second core substrate comprises positioning a first metal foil over a surface of the first core substrate such that a peripheral portion of the surface of the first core substrate is exposed from the first metal foil, a second metal foil over a surface of the second core substrate such that a peripheral portion of the surface of the second core substrate is exposed from the second metal foil, and a prepreg between the first metal foil and the second metal foil, and applying heat-pressing to the prepreg such that the first core substrate and the second core substrate are adhered through the prepreg on the peripheral portion of the surface of the first core substrate and the peripheral portion of the surface of the second core substrate, the outermost resin insulation layer of the first upper buildup layer has a thermal expansion coefficient which is lower than a thermal expansion coefficient of the first core substrate, the outermost resin insulation layer of the first lower buildup layer has a thermal expansion coefficient which is higher than a thermal expansion coefficient of the first core substrate, the outermost resin insulation layer of the second upper buildup layer has a thermal expansion coefficient which is lower than a thermal expansion coefficient of the second core substrate, the outermost resin insulation layer of the second lower buildup layer has a thermal expansion coefficient which is higher than a thermal expansion coefficient of the second core substrate, the outermost resin insulation layer of the first lower buildup layer does not have a reinforcing material, and the outermost resin insulation layer of the second lower buildup layer does not have a reinforcing material.

7. The method for manufacturing a printed wiring board according to claim 1, wherein the outermost resin insulation layer of the first upper buildup layer has a thermal expansion coefficient which is lower than a thermal expansion coefficient of the outermost resin insulation layer of the first lower buildup layer.

8. The method for manufacturing a printed wiring board according to claim 1, wherein the outermost resin insulation layer of the first upper buildup layer has a reinforcing material, the first core substrate has a reinforcing material, the reinforcing material in the outermost resin insulation layer of the first upper buildup layer has a thermal expansion coefficient which is lower than a thermal expansion coefficient of the reinforcing material in the first core substrate, the outermost resin insulation layer of the second upper buildup layer has a reinforcing material, the second core substrate has a reinforcing material, and the reinforcing material in the outermost resin insulation layer of the second upper buildup layer has a thermal expansion coefficient which is lower than a thermal expansion coefficient of the reinforcing material in the second core substrate material.

9. The method for manufacturing a printed wiring board according to claim 1, wherein the laminating of the first core substrate and the second core substrate comprises positioning a first metal foil over a surface of the first core substrate such that a peripheral portion of the surface of the first core substrate is exposed from the first metal foil, a second metal foil over a surface of the second core substrate such that a peripheral portion of the surface of the second core substrate is exposed from the second metal foil, and a prepreg between the first metal foil and the second metal foil, and applying heat-pressing to the prepreg such that the first core substrate and the second core substrate are adhered through the prepreg on the peripheral portion of the surface of the first core substrate and the peripheral portion of the surface of the second core substrate.

10. The method for manufacturing a printed wiring board according to claim 2, wherein the forming of the first upper buildup layer includes forming a pad configured to mount a semiconductor element, and the forming of the second upper buildup layer includes forming a pad configured to mount a semiconductor element.

11. The method for manufacturing a printed wiring board according to claim 6, wherein the forming of the first upper buildup layer includes forming a pad configured to mount a semiconductor element, and the forming of the second upper buildup layer includes forming a pad configured to mount a semiconductor element.

12. The method for manufacturing a printed wiring board according to claim 2, further comprising forming a solder-resist layer on at least one of the first lower buildup layer and the second lower buildup layer.

13. The method for manufacturing a printed wiring board according to claim 6, further comprising forming a solder-resist layer on at least one of the first lower buildup layer and the second lower buildup layer.

14. The method for manufacturing a printed wiring board according to claim 1, further comprising forming a solder-resist layer on at least one of the first lower buildup layer and the second lower buildup layer, wherein the forming of the first upper buildup layer includes forming a pad configured to mount a semiconductor element, and the forming of the second upper buildup layer includes forming a pad configured to mount a semiconductor element.

15. The method for manufacturing a printed wiring board according to claim 2, further comprising forming a solder-resist layer on at least one of the first lower buildup layer and the second lower buildup layer, wherein the forming of the first upper buildup layer includes forming a pad configured to mount a semiconductor element, and the forming of the second upper buildup layer includes forming a pad configured to mount a semiconductor element.

16. The method for manufacturing a printed wiring board according to claim 6, further comprising forming a solder-resist layer on at least one of the first lower buildup layer and the second lower buildup layer, wherein the forming of the first upper buildup layer includes forming a pad configured to mount a semiconductor element, and the forming of the second upper buildup layer includes forming a pad configured to mount a semiconductor element.

17. The method for manufacturing a printed wiring board according to claim 2, wherein the outermost resin insulation layer of the first upper buildup layer has a thermal expansion coefficient which is lower than a thermal expansion coefficient of the outermost resin insulation layer of the first lower buildup layer.

18. The method for manufacturing a printed wiring board according to claim 6, wherein the outermost resin insulation layer of the first upper buildup layer has a thermal expansion coefficient which is lower than a thermal expansion coefficient of the outermost resin insulation layer of the first lower buildup layer.

* * * * *